United States Patent
Iwase et al.

(10) Patent No.: US 6,992,933 B2
(45) Date of Patent: Jan. 31, 2006

(54) PROGRAMMING VERIFICATION METHOD OF NONVOLATILE MEMORY CELL, SEMICONDUCTOR MEMORY DEVICE, AND PORTABLE ELECTRONIC APPARATUS HAVING THE SEMICONDUCTOR MEMORY DEVICE

(75) Inventors: Yasuaki Iwase, Tenri (JP); Yoshifumi Yaoi, Yamatokoriyama (JP); Hiroshi Iwata, Nara (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1 day.

(21) Appl. No.: 10/848,614

(22) Filed: May 19, 2004

(65) Prior Publication Data

US 2004/0233727 A1 Nov. 25, 2004

(30) Foreign Application Priority Data

May 20, 2003 (JP) .............................. 2003-142145

(51) Int. Cl.
*G11C 11/34* (2006.01)
(52) U.S. Cl. .............................. 365/185.22; 365/185.2
(58) Field of Classification Search ............. 365/185.2, 365/185.22
See application file for complete search history.

(56) References Cited

U.S. PATENT DOCUMENTS

| | | | |
|---|---|---|---|
| 5,539,690 A | | 7/1996 | Talreja et al. |
| 5,729,490 A | * | 3/1998 | Calligaro et al. ...... 365/185.03 |
| 6,434,050 B2 | * | 8/2002 | Banks ...................... 365/185.2 |
| 6,885,579 B2 | * | 4/2005 | Sakimura et al. ........... 365/158 |

FOREIGN PATENT DOCUMENTS

| | | |
|---|---|---|
| JP | 5-81072 B2 | 11/1993 |
| JP | 5-304277 A | 11/1993 |
| JP | 9-116119 A | 5/1997 |
| JP | 2001-156188 A | 6/2001 |
| JP | 2001-156189 A | 6/2001 |
| JP | 2001-230332 A | 8/2001 |
| JP | 2002-190535 A | 7/2002 |

* cited by examiner

*Primary Examiner*—Michael Tran
(74) *Attorney, Agent, or Firm*—Birch, Stewart, Kolasch & Birch, LLP

(57) ABSTRACT

A method of verifying programming of a nonvolatile memory cell to a desired state, the method comprising the steps of: selecting first and second references respectively corresponding to first and second voltages; applying a programming voltage to the memory cell; sensing a threshold voltage level of the memory cell; and comparing the sensed threshold voltage level with the first and second references and, in the case where the threshold voltage level is higher than the first reference and lower than the second reference, indicating that the memory cell is programmed into the desired state, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

35 Claims, 20 Drawing Sheets

PROGRAMMING VERIFICATION METHOD OF NONVOLATILE MEMORY CELL, SEMICONDUCTOR MEMORY DEVICE, AND PORTABLE ELECTRONIC APPARATUS HAVING THE SEMICONDUCTOR MEMORY DEVICE

CROSS-REFERENCE TO RELATED APPLICATION

This application is related to Japanese application No.2003-142145 filed on May 20, 2003 whose priority is claimed under 35 USC §119, the disclosure of which is incorporated by reference in its entirety.

BACKGROUND OF THE INVENTION

1. Field of the Invention

The present invention relates to a programming verification method of a nonvolatile memory cell, a semiconductor memory device, and a portable electronic apparatus having the semiconductor memory device. More specifically, the present invention relates to a programming verification method or refreshing method of a memory cell including a memory functional unit having the function of retaining charges, a semiconductor memory device in which the memory cells are arranged, and a portable electronic apparatus having such a semiconductor memory device.

2. Description of the Related Art

Conventionally, a flash memory has been typically used as a nonvolatile memory.

As shown in FIG. 22, in such a flash memory, a floating gate 902, an insulating film 907 and a word line (control gate) 903 are formed in this order on a semiconductor substrate 901 via a gate insulating film. On both sides of the floating gate 902, a source line 904 and a bit line 905 are formed in diffusion regions, thereby forming a memory cell. Around the memory cell, a device isolation region 906 is formed (see, for example, Japanese Unexamined Patent Publication No. 5-304277(1993)).

The memory cell retains data according to a charge amount in the floating gate 902. In a memory cell array constructed by arranging memory cells, by selecting a specific word line and a specific bit line and applying a predetermined voltage, an operation of rewriting/reading a desired memory cell can be performed.

In such a flash memory, when a charge amount in the floating gate changes, a drain current (Id)-gate voltage (Vg) characteristic as shown in FIG. 23 is displayed. In FIG. 23, a solid line shows the characteristics in a writing state while a dashed line shows the characteristics in an erasing state. When the amount of negative charges in the floating gate increases, the threshold increases, and an Id-Vg curve shifts almost in parallel in the direction of increasing Vg.

However, in the above-described flash memory, it has been functionally necessary to dispose the insulating film 907 for separating the floating gate 902 and the word line 903 from each other, and further, it has been difficult to reduce the thickness of the gate insulating film in order to prevent any leakage of charges from the floating gate 902. As a consequence, it has been difficult to effectively reduce the thickness of each of the insulating film 907 and the gate insulating film, thereby inhibiting the microfabrication of the memory cell.

SUMMARY OF THE INVENTION

Provided herein is a programming verification method of a nonvolatile memory cell which facilitates its microfabrication, a semiconductor memory device, and a portable electronic apparatus having the semiconductor memory device.

Disclosed herein are a method of verifying programming of a nonvolatile memory cell in a semiconductor memory device to a desired state, the semiconductor memory device including at least one nonvolatile memory cell having two possible states, each state corresponding to threshold voltage levels within a predetermined range, the nonvolatile memory cell holding a voltage level indicative of one of the two states, the method including the steps of: selecting first and second references respectively corresponding to first and second voltages, the first and second voltages specifying a lower limit and an upper limit, respectively, of a voltage level within a predetermined range, the voltage level indicative of the desired state; applying a programming voltage to the nonvolatile memory cell; sensing a threshold voltage level of the nonvolatile memory cell; and comparing the sensed threshold voltage level of the nonvolatile memory cell with the first and second references and, in the case where the threshold voltage level of the nonvolatile memory cell is higher than the first reference and lower than the second reference, indicating that the nonvolatile memory cell is programmed into the desired state, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

It is therefore possible to provide a programming verification method of verifying that a memory cell having two possible states is written in a desired state without being under-programmed or over-programmed.

In the nonvolatile memory cell used in the disclosed programming verification method, a memory function of the memory functional unit and a transistor operation function of the gate insulating film are separated from each other. Consequently, it is easy to suppress the short channel effect by thinning the gate insulating film while remaining the sufficient memory function. Further, a value of current flowing between the diffusion regions by rewriting changes larger as compared with the case of an EEPROM. Therefore, it facilitates discrimination between the writing state and the erasing state of the semiconductor memory device.

Further, the nonvolatile memory cell in the semiconductor memory device can be formed by a process which has very high affinity with a normal transistor forming process on the basis of the configuration. Therefore, as compared with the case of using a conventional flash memory as a nonvolatile memory cell and forming the memory cell together with a peripheral circuit which is usually made by a transistor, the number of masks and the number of processes can be dramatically reduced. Consequently, the yield of a chip on which the memory cell and the peripheral circuit are formed together can be improved. Because of this, the manufacturing cost is reduced, and a very-reliable, cheap semiconductor memory device can be obtained.

The programming verification method according to an embodiment of the present invention may further include a plurality of steps of: applying a programming voltage to the nonvolatile memory cell when the threshold voltage level of the nonvolatile memory cell is lower than the threshold voltage level of the first reference; comparing the threshold voltage level of the nonvolatile memory cell with the first and second references; and repeating the above steps in this order until the threshold voltage level of the nonvolatile memory cell becomes higher than the threshold voltage of the first reference.

Alternatively, the programming verification method may further include the step of: indicating that the nonvolatile memory cell is over-programmed when the threshold voltage level of the nonvolatile memory cell is higher than the second reference.

The programming verification method may further include the step of: executing the step of receiving data indicating that the nonvolatile memory cell is in the desired state and selecting the first reference and the step of receiving the data and selecting the second reference in accordance with the received data.

Also provided is a method of verifying programming of a nonvolatile memory cell in a semiconductor memory to a desired state, the semiconductor memory device including at least one nonvolatile memory cell having two possible states, each state corresponding to threshold voltage levels within a predetermined range, the nonvolatile memory cell holding a voltage level indicative of one of the two states, the method including the steps of: selecting a first reference, the first reference specifying a lower limit of a voltage level within a predetermined range, the voltage level for indicating the desired state; applying a programming voltage to the nonvolatile memory cell; sensing a threshold voltage level of the nonvolatile memory cell; and comparing the sensed threshold voltage level of the nonvolatile memory cell with the first reference and, in the case where the threshold voltage level of the nonvolatile memory cell is higher than the first reference, indicating that the nonvolatile memory cell is programmed into the desired state, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges. It is therefore possible to provide a programming verification method of verifying that a memory cell having two possible states is written in a desired state.

The programming verification method may further include a plurality of steps of: applying a programming voltage to the nonvolatile memory cell; comparing the threshold voltage level of the nonvolatile memory cell with the first reference; and, in the case where the threshold voltage level of the nonvolatile memory cell is lower than the threshold voltage level of the first reference, repeating the above steps in this order until the threshold voltage level of the nonvolatile memory cell becomes higher than the threshold voltage of the first reference.

Also provided is a method of verifying whether a nonvolatile memory cell in a semiconductor memory device is over-programmed, the semiconductor memory device including at least one nonvolatile memory cell having two possible states, each state corresponding to threshold voltage levels within a predetermined range, the nonvolatile memory cell holding a voltage level indicative of one of the two states, the method including the steps of: selecting a first reference corresponding to a first voltage specifying an upper limit of a voltage level within a predetermined range, the voltage level for indicating the desired state; sensing a threshold voltage level of the nonvolatile memory cell; and comparing the sensed threshold voltage level of the nonvolatile memory cell with the first reference and, in the case where the threshold voltage level of the nonvolatile memory cell is higher than the first reference, indicating that the nonvolatile memory cell is over-programmed, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

An embodiment of the present invention also provides a method of refreshing and setting a nonvolatile memory cell in a semiconductor memory device into a desired state, the semiconductor memory device including at least one nonvolatile memory cell having two possible states, each state corresponding to threshold voltage levels within a predetermined range, the nonvolatile memory cell holding a voltage level indicative of one of the two states, the method including the steps of: selecting a first reference, the first reference specifying a lower limit of a voltage level within a predetermined range, the voltage level for indicating the desired state; sensing a threshold voltage level of the nonvolatile memory cell; comparing the sensed threshold voltage level of the nonvolatile memory cell with the first reference; and applying a programming voltage to the nonvolatile memory cell, comparing the threshold voltage level of the nonvolatile memory cell with the first reference and, in the case where the threshold voltage level of the nonvolatile memory cell is lower than that of the first reference, sequentially repeating the above steps until the threshold voltage level of the nonvolatile memory cell becomes higher than the first reference, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

Also disclosed is a semiconductor memory device including at least one nonvolatile memory cell including a programming circuit for verifying programming, to a desired state, of a nonvolatile memory cell having two possible states, each state corresponding to threshold voltage levels within a predetermined range, the nonvolatile memory cell holding a voltage level indicative of one of the states, the semiconductor memory device including a programming circuit for verifying programming of the nonvolatile memory cell to a desired state, the programming circuit including: a plurality of read references corresponding to read voltages of the plurality of states, respectively; a first reference corresponding to a first voltage, the first voltage specifying a lower-limit value of the desired state; a second reference corresponding to a second voltage, the second voltage specifying an upper-limit value of the desired state; a control engine connected between the nonvolatile memory cell and the first and second references to apply a programming voltage to the nonvolatile memory cell for programming the nonvolatile memory cell into the desired state, to generate a selection signal for selecting the first and second references, and to sense the present state of the nonvolatile memory cell; and a sense circuit connected to the first and second references in accordance with the selection signal and connected to the nonvolatile memory cell and the control engine, the sense circuit for sensing the presently retained voltage of the nonvolatile memory cell, the sense circuit including: (i) a first comparator, connected to the nonvolatile memory cell, the control engine and the first reference, for comparing a threshold voltage level of the nonvolatile memory cell with the first reference and, in the case where the threshold voltage level of the nonvolatile memory cell is higher than the first reference, outputting a first result signal to the control engine; and (ii) a second comparator, connected to the nonvolatile memory cell, the control engine and the second reference, for comparing the threshold voltage level of the nonvolatile memory cell with the second reference and, in the case where the threshold voltage of the nonvolatile memory cell is lower than the second reference, outputting the second result signal to the control engine, the sense circuit indicating that the nonvolatile memory cell is programmed into the desired state from outputs of the first and second result signals of the first and second comparators, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

In the semiconductor memory device according to an embodiment of the present invention, each of the first and second references may be a reference memory cell.

The semiconductor memory device may further include first and second values each showing a desired state; and a control engine for comparing a first result signal with the first value and, in the case where the first result signal is not equal to the first value, applying a programming voltage.

Also provided is a semiconductor memory device including at least one nonvolatile memory cell including a programming circuit for verifying programming, to a desired state, of a nonvolatile memory cell having two possible states, each state corresponding to threshold voltage levels within a predetermined range, the nonvolatile memory cell holding a voltage level indicative of one of the states, the semiconductor memory device including a programming circuit for verifying programming of the nonvolatile memory cell to a desired state, the programming circuit including: a plurality of read references corresponding to read voltages of the plurality of states, respectively; a first reference corresponding to a first voltage, the first voltage specifying a lower-limit value of the desired state; a control engine connected between the nonvolatile memory cell and a second reference to apply a programming voltage to the nonvolatile memory cell for programming the nonvolatile memory cell into the desired state, to generate a selection signal for selecting the first reference, and to sense the present state of the nonvolatile memory cell; and a sense circuit connected to the first reference in accordance with the selection signal and connected to the nonvolatile memory cell and the control engine, sense circuit for sensing the presently retained voltage of the nonvolatile memory cell, the sense circuit including: a first comparator, connected to the nonvolatile memory cell, the control engine and the first reference, for comparing a threshold voltage level of the nonvolatile memory cell with the first reference and, in the case where the threshold voltage level of the nonvolatile memory cell is higher than the first reference, outputting a result signal indicating that the nonvolatile memory cell is programmed into the desired state to the control engine, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

The first reference may be a reference memory cell.

The semiconductor memory device may further include a first value showing a desired state; and a control engine for comparing a first result with the first value and, in the case where the first result is not equal to the first value, applying the programming voltage.

In the disclosed semiconductor memory device, the nonvolatile memory cell may include a film which extends substantially parallel with a side face of the gate electrode and has the function of retaining charges.

With the configuration, charges injected into the memory functional units increase and the programming speed increases.

In the semiconductor memory device according to an embodiment of the present invention, the nonvolatile memory cell may include a film having a surface which extends almost parallel with a surface of the gate insulating film and having the function of retaining charges, and an insulating film for separating the film from a channel region or a semiconductor layer, and the thickness of the insulating film is larger than that of the gate insulating film and is 0.8 nm or more.

With the configuration, injection of charges into the memory functional units is facilitated and programming can be made at high speed.

In the disclosed semiconductor memory device, the nonvolatile memory cell may include a film having a surface substantially parallel with a surface of the gate insulating film and having the function of retaining charges.

With the configuration, variations in the memory effect can be suppressed.

Also provided is a semiconductor memory device including at least one nonvolatile memory cell including a programming circuit for verifying programming, to a desired state, of a nonvolatile memory cell having two possible states, each state corresponding to threshold voltage levels within a predetermined range, the nonvolatile memory cell holding a voltage level indicative of one of the states, the semiconductor memory device including a circuit for sensing over-programming of the nonvolatile memory cell, the sensing circuit including: a plurality of read references corresponding to read voltages of the plurality of states, respectively; a first reference corresponding to a first voltage, the first voltage specifying an upper-limit value of the desired state; a control engine connected to the nonvolatile memory cell and the first reference for generating a selection signal to select the first reference and for sensing the present state of the nonvolatile memory cell; and a sense circuit connected to the first reference in accordance with the selection signal and connected to the nonvolatile memory cell and the control engine, the sense circuit for sensing the presently retained voltage of the nonvolatile memory cell, the sense circuit including: a first comparator, connected to the nonvolatile memory cell, the control engine and the first reference, for comparing a threshold voltage level of the nonvolatile memory cell with the first reference and, in the case where the threshold voltage level of the nonvolatile memory cell is higher than the first reference, outputting a result signal to the control engine, the result signal indicating that the nonvolatile memory cell is over-programmed, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

The first reference may be a reference memory cell.

The semiconductor memory device may further include a first value showing a desired state; and a control engine for comparing a first result signal with the first value and, in the case where the first result signal is not equal to the first value, indicating that the nonvolatile memory cell is over-programmed.

A portable electronic device of an embodiment of the present invention may include any of the above-described semiconductor memory devices.

DETAILED DESCRIPTION OF THE INVENTION

Figure 1:
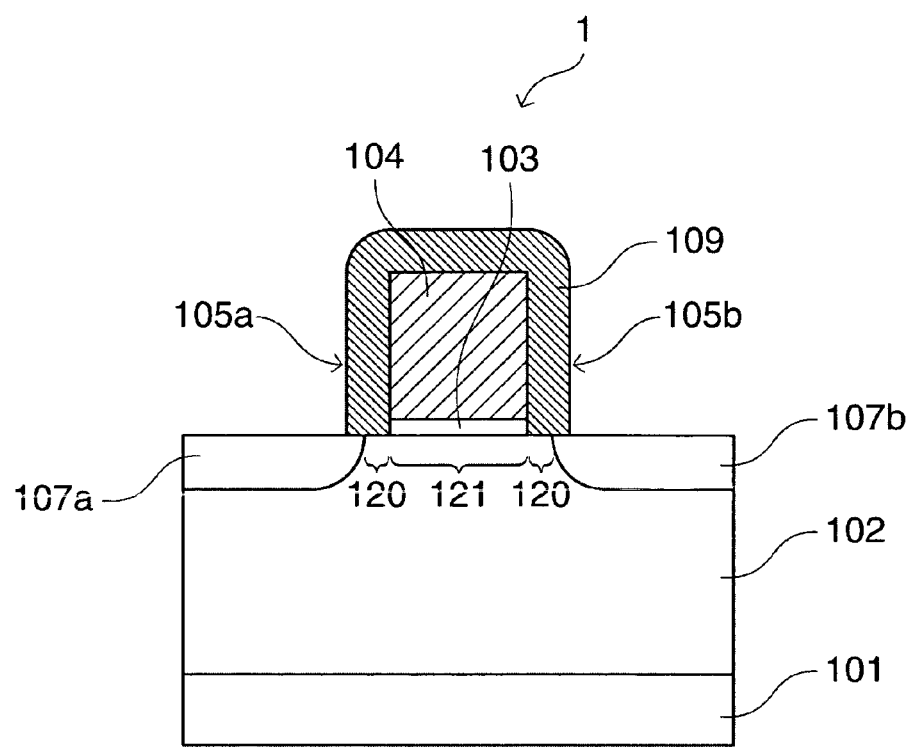
FIG. 1 is a schematic sectional view showing a main part of a memory cell (first embodiment) in a semiconductor memory device according to an embodiment of the present invention.

A semiconductor memory device according to an embodiment of the present invention is mainly constructed by a nonvolatile memory cell, a reference cell and a program circuit for programming the reference cell in a reference state. Herein, the program means that a desired amount of charges is accumulated in each of the nonvolatile memory cell and the reference cell. Furthermore, the program circuit is a circuit for accumulating the desired amount of charges in each of the nonvolatile memory cell and the reference cell. It is noted that the semiconductor memory device basically adopts a MOS circuit. It is preferable to mount all of the circuits inclusive of the MOS circuit on a single semiconductor substrate.

The nonvolatile memory cell in the semiconductor memory device is mainly constructed by a semiconductor layer, a gate insulating film, a gate electrode, a channel region, a diffusion region and a memory functional unit. Herein, the channel region is normally a region of the same conductive type as that of the semiconductor layer and denotes a region immediately below the gate electrode. The diffusion region denotes a region of the conductive type opposite to that of the channel region.

Concretely, the disclosed nonvolatile memory cell may be constructed by a region of a first conductive type as a diffusion region, a region of a second conductive type as a channel region, a memory functional unit disposed across a border of the regions of the first and second conductive types, and an electrode provided via a gate insulating film. It is suitable that the nonvolatile memory cell is constructed by a gate electrode formed on a gate insulating film, two memory functional units formed on both sides of the gate electrode, two diffusion regions disposed on the opposite sides of the gate electrode of the memory functional units, and a channel region disposed below the gate electrode. Hereinafter, the nonvolatile memory cell will be referred to as a sidewall memory cell.

In the semiconductor device, the semiconductor layer is formed on the semiconductor substrate, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer and a body region may be provided below a channel region.

The gate insulating film is not particularly limited as long as it is usually used for a semiconductor device, and an example thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is formed preferably in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and an example of thereof includes a conductive film, for example, a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. Below the gate electrode, a channel region is formed.

Preferably, the gate electrode is formed only on the sidewalls of the memory functional unit or does not cover the top part of the memory functional unit. By such arrangement, a contact plug can be disposed closer to the gate electrode, so that reduction in the size of the memory cell is facilitated. It is easy to manufacture the sidewall memory cell having such simple arrangement, so that the yield can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

By using the insulating film including a film having the charge retaining function such as a silicon nitride film as the memory functional unit, reliability of storage and retention can be increased. Since the silicon nitride film is an insulator, even in the case where a charge leak occurs in part of the silicon nitride film, the charges in the whole silicon nitride film are not lost immediately. In the case of arranging a plurality of sidewall memory cells, even when the distance between the sidewall memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

In order to increase the reliability of storage and retention, the film having the charge retaining function does not always have to have a film shape. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternatively, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of a film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth almost the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly important that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film is made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The sidewall memory cell can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface of the opening, and the gate electrode material film is patterned in a shape including the opening and larger than the opening, thereby forming the gate electrode and the memory functional unit.

One example of a method for forming a sidewall memory cell will now be described. First, the gate insulating film and the gate electrode are formed on the semiconductor substrate in accordance with known procedures. Subsequently, a silicon oxide film having a thickness of 0.8 to 20 nm, more preferably 3 to 10 nm is formed by thermal oxidation or deposited by CVD (Chemical Vapor Deposition) over the entire semiconductor substrate. Next, a silicon nitride film having a thickness of 2 to 15 nm, more preferably 3 to 10 nm is deposited by the CVD over the entire silicon oxide film. Moreover, another silicon oxide film having a thickness of 20 to 70 nm is deposited by the CVD over the entire silicon nitride film.

Subsequently, the silicon oxide film/silicon nitride film/silicon oxide film are etched back by anisotropic etching, thereby forming the memory functional unit optimum for storing data on the sidewall of the gate electrode in the form of a sidewall spacer.

Thereafter, ions are injected while using the gate electrode and the memory functional unit in the form of the sidewall spacer as masks, thereby forming a diffusion layer region (source/drain region). After that, a silicide process or an upper wiring process may be performed in accordance with known procedures.

In the case of constructing the memory cell array by arranging sidewall memory cells, the best mode of the sidewall memory cell satisfies all of the requirements: for example, (1) the gate electrodes of a plurality of sidewall memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface almost parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is almost parallel with the surface of the gate insulating film from the channel region or semiconductor layer and the thickness of the gate insulating film are different from each other; (8) an operation of writing/erasing one sidewall memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. Benefits are obtained even when fewer than all 10 requirements are satisfied. It is sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the sidewall memory cell satisfies the requirements (3) and (9), it is very useful for the following reasons. First, the bit line contact can be disposed closer to the memory functional unit on the word line sidewall or even when the distance between sidewall memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between sidewall memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each sidewall memory cell. For example, the memory functional units formed on both sides of a single word line shared by a plurality of sidewall memory cells do not have to be isolated for each sidewall memory cell. The memory functional units formed on both sides of one word line can be shared by a plurality of sidewall memory cells sharing the word line. Consequently, a photo etching process for isolating the memory functional unit becomes unnecessary, and the manufacturing process is simplified. Further, a margin for positioning in the photolithography process and a margin for film reduction by etching become unnecessary, so that the margin between neighboring sidewall memory cells can be reduced. Therefore, as compared with the case where the charge retaining region in the memory functional unit is made of a conductor (for example, polysilicon film), even when the memory functional unit is formed at the same microfabrication level, a sidewall memory cell occupied area can be reduced. In the case where the charge retaining region in the memory functional unit is made of a conductor, the photo etching process for isolating the memory functional unit for each sidewall memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield can be increased. Therefore, it facilitates formation with a transistor as a component of a logic circuit or an analog circuit, and a cheap semiconductor memory device can be obtained.

The present invention is more useful in embodiments that satisfy not only the requirements (3) and (9) but also the requirement (6).

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a sidewall memory cell is dominant more than that of a sidewall memory cell. Consequently, omission or down sizing of the voltage boosting circuit for a sidewall memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

In the disclosed semiconductor memory device, a transistor may be connected in series with one of or both sides of a sidewall memory cell, or the sidewall memory cell may be mounted on the same chip with a logic transistor. In such a case, the semiconductor device, particularly, the sidewall memory cell can be formed by a process having high compatibility with a process of forming a normal standard transistor such as a transistor or a logic transistor, they can be formed simultaneously. Therefore, a process of forming both the sidewall memory cell and a transistor or a logic transistor is very simple and, as a result, a cheap embedded device can be obtained.

The sidewall memory cell can store information of two or more values in one memory functional unit. Thus, the sidewall memory cell can function as a memory cell for storing information of four or more values. The sidewall memory cell may store binary data only. The sidewall memory cell is also allowed to function as a memory cell having the functions of both a selection transistor and a memory transistor by a variable resistance effect of the memory functional unit.

The semiconductor memory device of an embodiment of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multi-processor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device may be provided as at least a part of a control circuit or a data storing circuit of an electronic device or, as necessary, detachably assembled.

DESCRIPTION OF THE PREFERRED EMBODIMENTS

Hereinafter, embodiments of the semiconductor memory device, the display device and the portable electronic apparatus of the present invention will be described in detail with reference to the drawings.

First Embodiment

A semiconductor memory device of a first embodiment has a sidewall memory cell 1 as shown in FIG. 1.

The sidewall memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
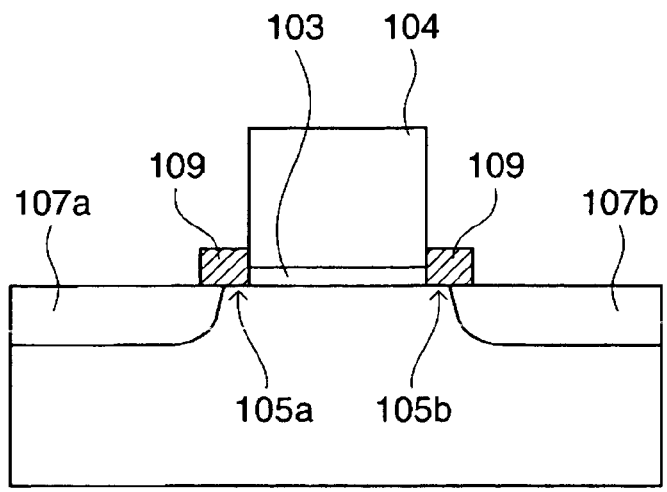
FIG. 2.(a) and FIG. 2.(b) are schematic sectional views each showing a main part of a modification of the memory cell (first embodiment) in the semiconductor memory device according to an embodiment of the present invention.
Figure 2B:
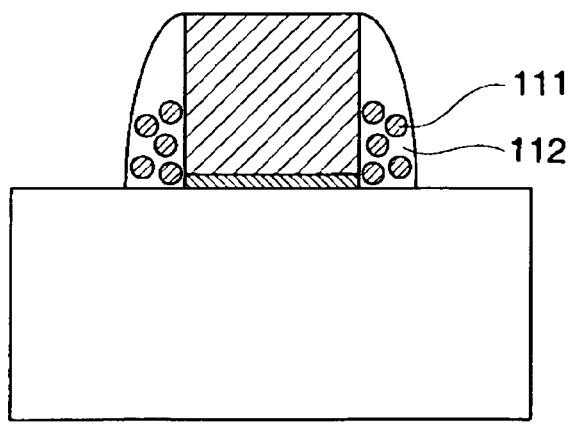

The memory functional units 105a and 105b for substantially retaining charges are the parts on both sidewalls of the gate electrode 104. It is therefore sufficient that the silicon nitride film 109 is formed only in regions corresponding to the parts (see FIG. 2.(a)). Each of the memory functional units 105a and 105b may have a structure in which fine particles 111 each made of a conductor or semiconductor and having a nanometer size are distributed like discrete points in an insulating film 112 (see FIG. 2.(b)). When the fine particle 111 has a size less than 1 nm, a quantum effect is too large, so that it becomes hard for charges to go (tunnel) to the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the sidewall memory cell will be described with reference to FIGS. 3 and 4. The case where whole memory functional units 131a and 131b have the function of retaining charges will be described. "Writing" denotes herein injection of electrons into the memory functional units 131a and 131b when the sidewall memory cell is of the N channel type. Hereinafter, on assumption that the sidewall memory cell is of the N channel type, description will be given.

Figure 3:
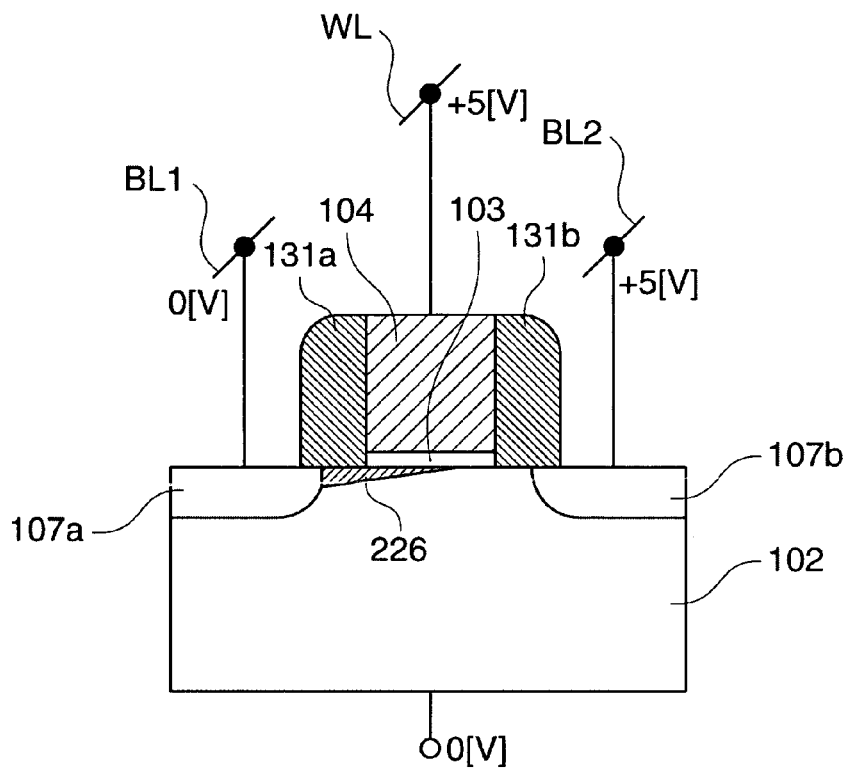
FIG. 3 is a diagram for describing a writing operation of the memory cell (first embodiment) in the semiconductor memory device according to an embodiment of the present invention.

In order to inject electrons (write) the second memory functional unit 131b, as shown in FIG. 3, the first diffusion region 107a of the N type is set as a source electrode, and the second diffusion region 107b of the N type is set as a drain electrode. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). By injection of the hot electrons into the second memory functional unit 131b, writing is performed. Since hot electrons are not generated in the vicinity of the first memory functional unit 131a, writing is not performed.

Figure 4:
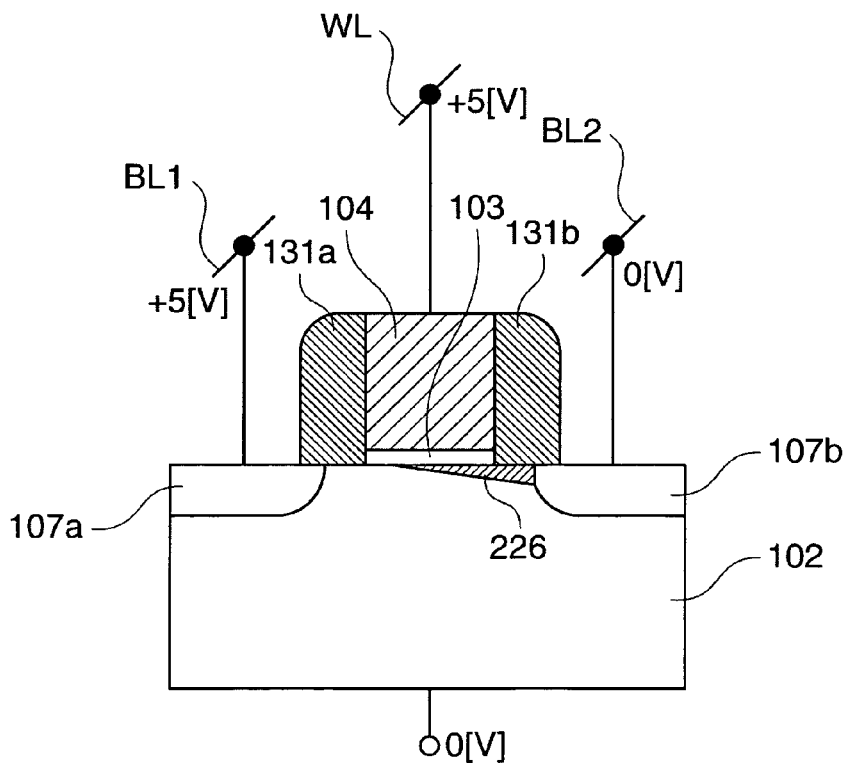
FIG. 4 is a diagram for describing a writing operation of the memory cell (first embodiment) in the semiconductor memory device according to an embodiment of the present invention.

On the other hand, in order to inject electrons (write) into the first memory functional unit 131a, as shown in FIG. 4, the second diffusion region 107a is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. By interchanging the source and drain regions so as to be different from the case of injecting electrons into the second memory functional unit 131b, electrons are injected into the first memory functional unit 131a and writing can be performed.

The principle of erasing operation of the sidewall memory cell will now be described with reference to FIGS. 5 and 6.

Figure 5:
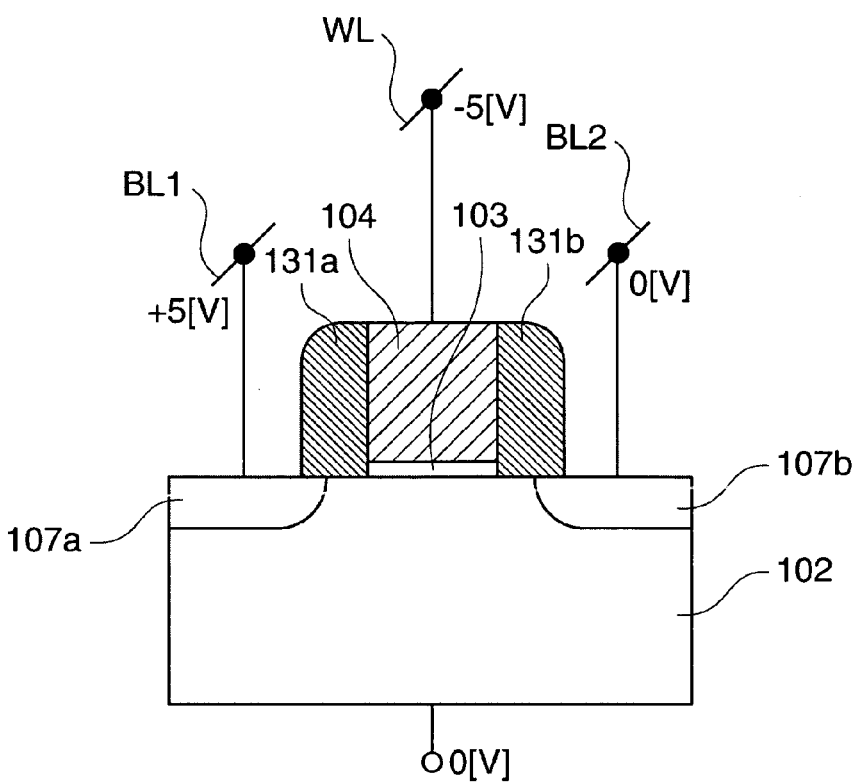
FIG. 5 is a diagram for describing an erasing operation of the memory cell (first embodiment) in the semiconductor memory device according to an embodiment of the present invention.

In a first method of erasing information stored in the first memory functional unit 131a, by applying positive voltage (for example, +5 V) to the first diffusion region 107a and applying 0 V to the P-type well region 102 as shown in FIG. 5, the PN junction between the first diffusion region 107a and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
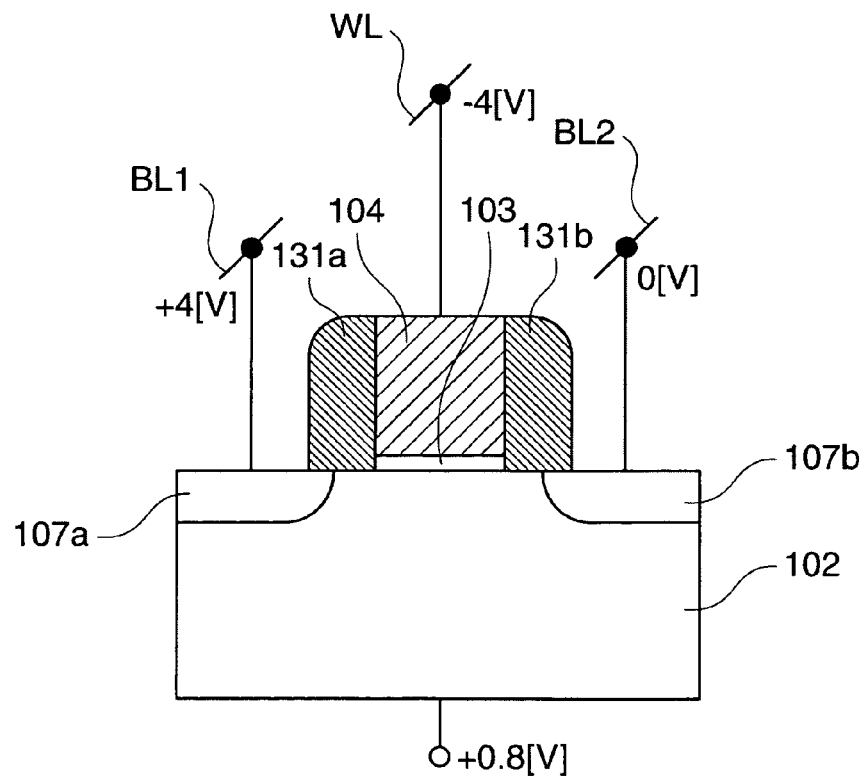
FIG. 6 is a diagram for describing an erasing operation of the memory cell (first embodiment) in the semiconductor memory device according to an embodiment of the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the sidewall memory cell due to hot carriers can be suppressed.

In any of the erasing methods, over-erasure does not occur easily in the sidewall memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a sidewall memory cell becomes impossible occurs. On the other hand, in the present sidewall memory cell, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Figure 7:
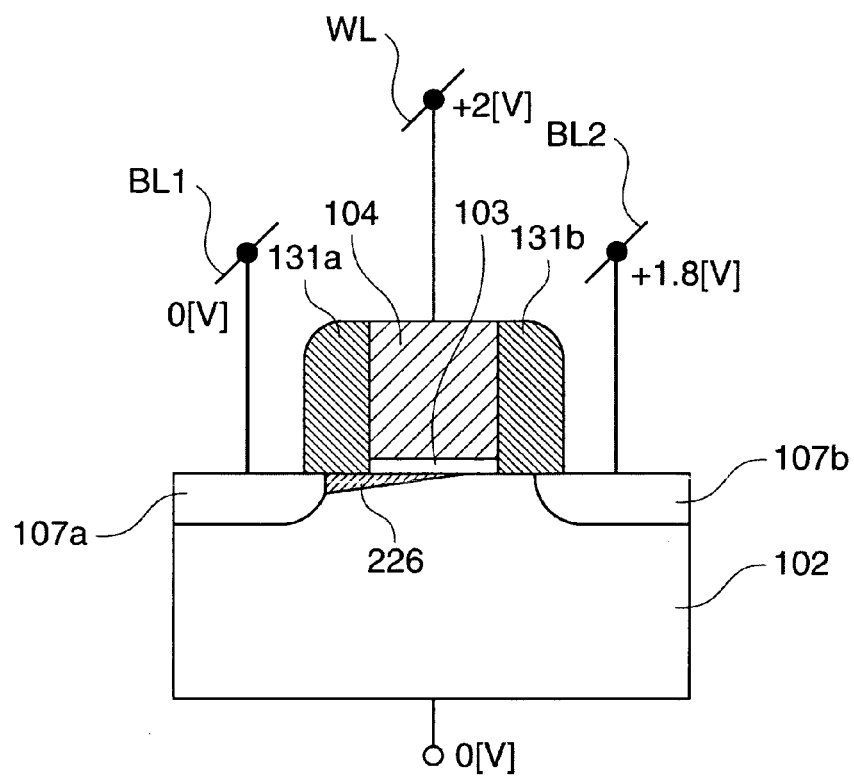
FIG. 7 is a diagram for describing a reading operation of the memory cell (first embodiment) in the semiconductor memory device according to an embodiment of the present invention.

Further, the principle of reading operation of the sidewall memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. In the case of applying a voltage so as to perform the pinch-off operation, thereby reading information, it is possible to determine with higher accuracy the state of charge accumulation in the first memory functional unit 131a without influence of the presence/absence of charge accumulation in the second memory functional unit 131b. The presence/absence of charge accumulation in the second memory functional unit 131b does not exert an influence on the drain current since the pinch-off point occurs in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/ erased selectively per one transistor. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be constructed.

In the above-described operating method, by interchanging the source electrode and the drain electrode, writing and erasing of two bits per one transistor are performed. Alternately, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As should be apparent from the above description, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
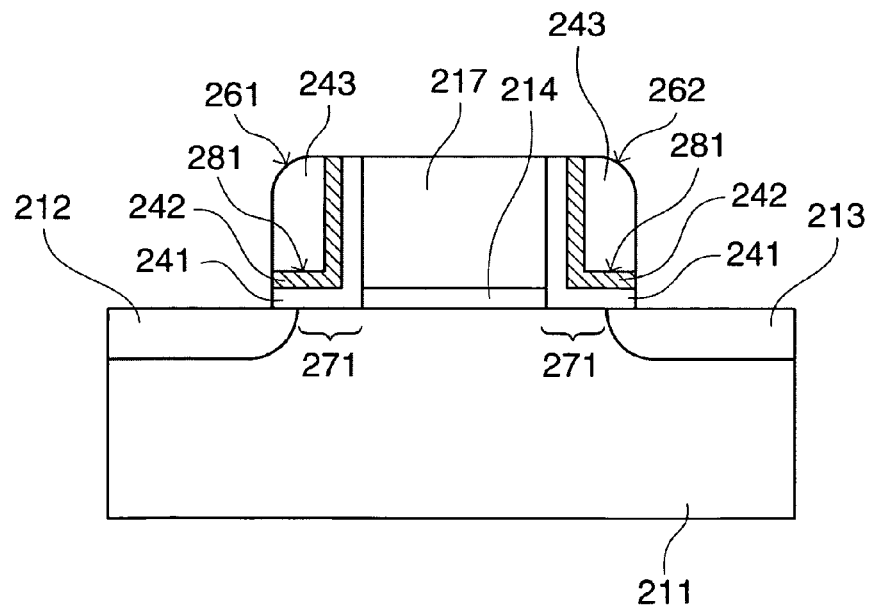
FIG. 8 is a schematic sectional view showing a main part of a memory cell (second embodiment) in the semiconductor memory device according to an embodiment of the present invention.

A sidewall memory cell in a semiconductor memory device according to a second embodiment has a configuration substantially similar to that of the sidewall memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film is regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the sidewall memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
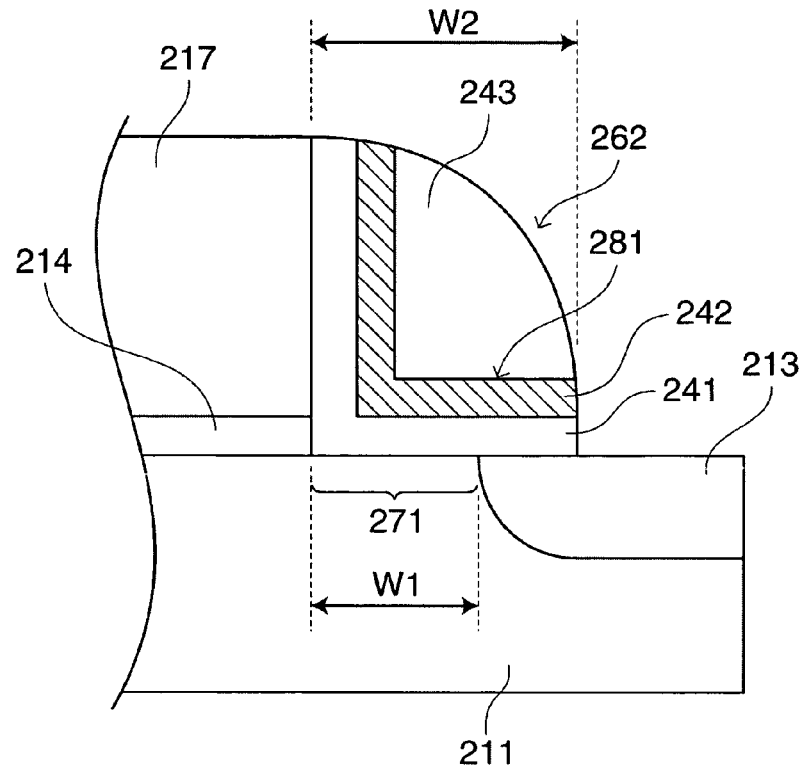
FIG. 9 is an enlarged schematic sectional view of the main part shown in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
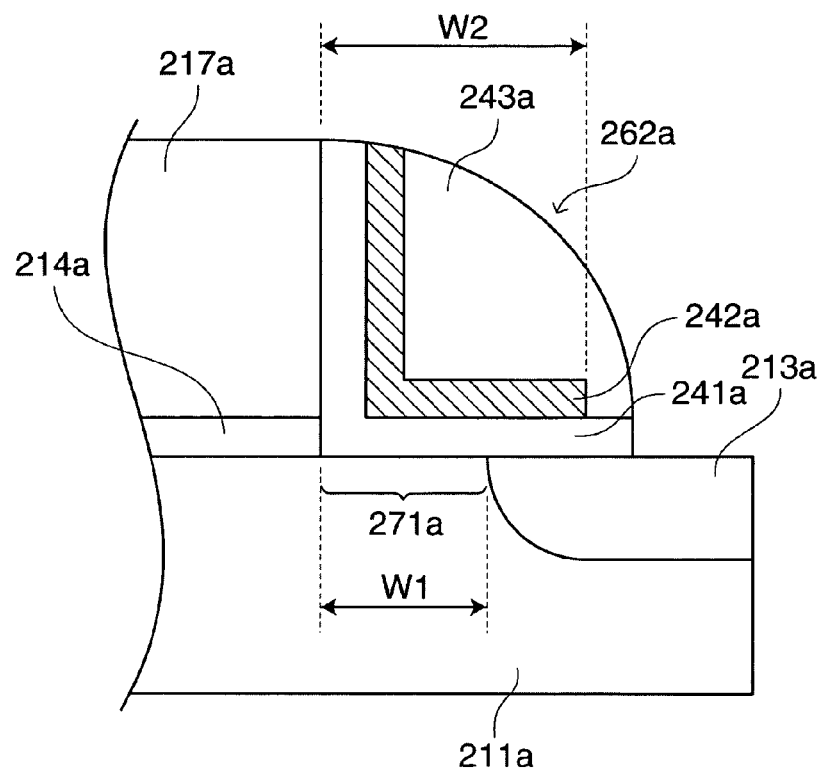
FIG. 10 is an enlarged schematic sectional view of a modification of the main part shown in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
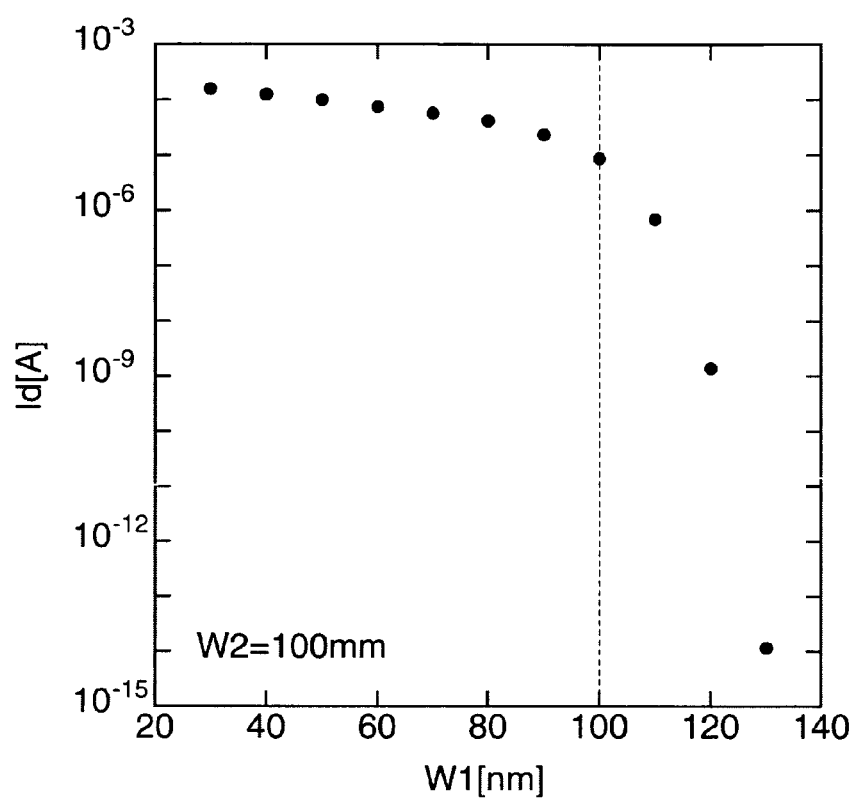
FIG. 11 is a graph showing electric characteristics of the memory cell (second embodiment) in the semiconductor memory device according to an embodiment of the present invention.

FIG. 11 shows drain current Id when the width W2 of the memory functional unit 262 is fixed to 100 nm and the offset amount W1 is changed in the structure of the sidewall memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, sidewall memory cell arrays were produced. In the case where W1 is 60 nm, the silicon nitride film 242 and the diffusion regions 212 and 213 overlap with each other by 40 nm as a design value. In the case where W1 is 100 nm, there is no overlap as a design value. Reading time of the sidewall memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
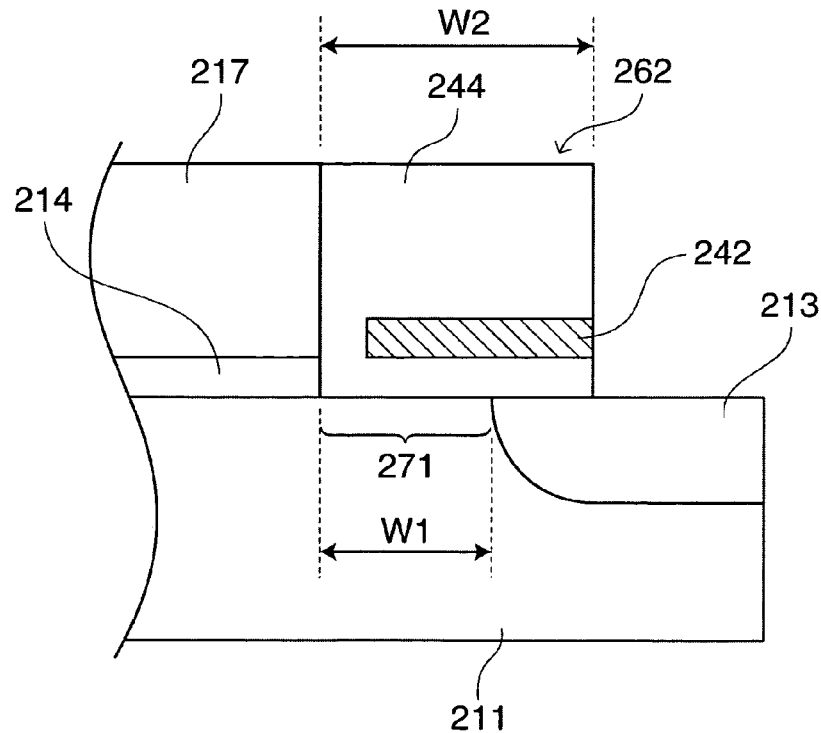
FIG. 12 is a schematic sectional view showing a main part of a modification of the memory cell (second embodiment) in the semiconductor memory device according to an embodiment of the present invention.

The memory functional unit preferably includes the charge retaining film disposed substantially in parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface substantially parallel to the surface of the gate insulating film 214. In other words, it is preferable that the silicon nitride film 242a is formed at a level parallel to the level corresponding to the surface of the gate insulating film 214.

By the existence of the silicon nitride film 242a substantially parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a substantially parallel with the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is substantially parallel to the surface of the gate insulating film 214 and the channel region (or well region). By the insulating film, dissipation of the charges accumulated in the charge retaining film is suppressed and a sidewall memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be substantially controlled, and variations in the memory effect of the sidewall memory cell can be reduced very much.

Third Embodiment

Figure 13:
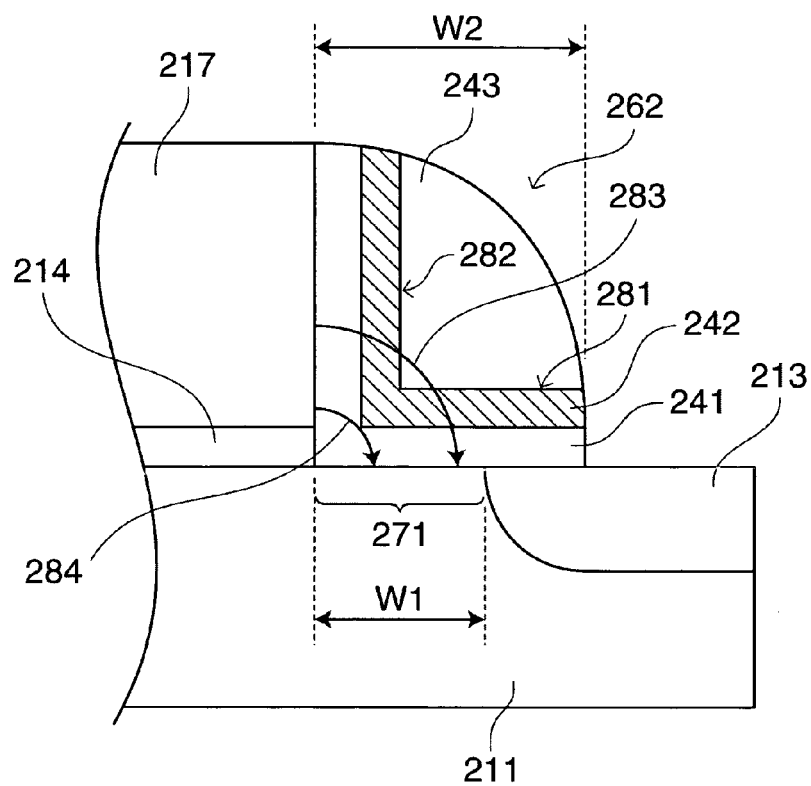
FIG. 13 is a schematic sectional view showing a main part of a memory cell (third embodiment) in the semiconductor memory device according to an embodiment of the present invention.

The memory functional unit 262 in a semiconductor memory device of a third embodiment has a shape in which the silicon nitride film 242 as a charge retaining film has substantially uniform thickness and is disposed almost in parallel with the surface of the gate insulating film 214 as shown in FIG. 13 (region 281) and, further, almost in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended substantially parallel with the side face of the gate electrode. The insulating film prevents injection of charges from the gate electrode into the charge retaining film and accordingly prevents a change in the electric characteristics. Thus, the reliability of the sidewall memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

Fourth Embodiment

In a fourth embodiment, optimization of the gate electrode, the memory functional unit, and the distance between the source and drain regions of a sidewall memory cell in a semiconductor memory device will be described.

Figure 14:
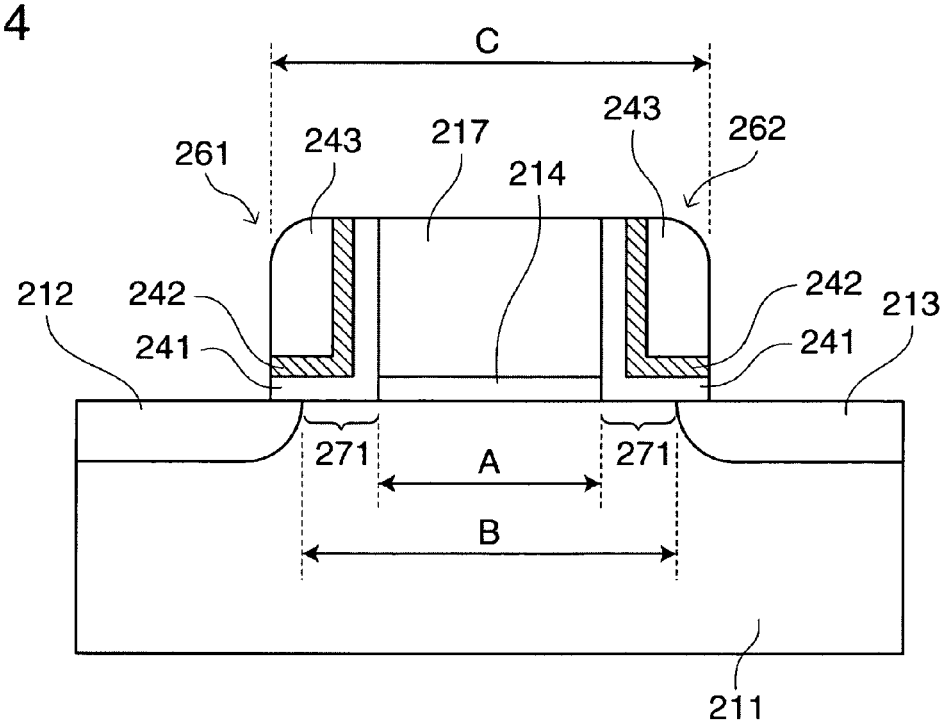
FIG. 14 is a schematic sectional view showing a main part of a memory cell (fourth embodiment) in the semiconductor memory device according to an embodiment of the present invention.

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a sidewall memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
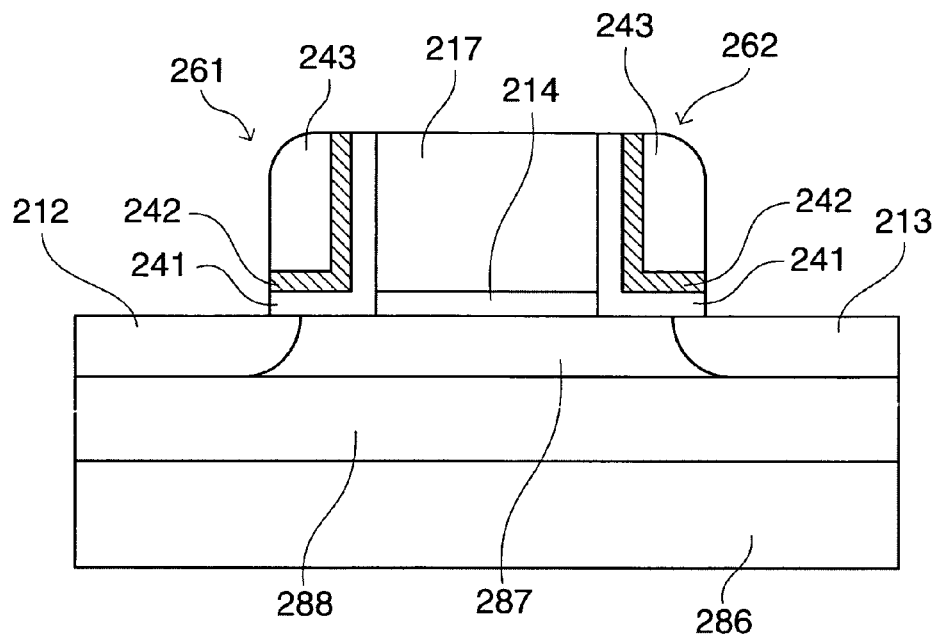
FIG. 15 is a schematic sectional view showing a main part of a memory cell (fifth embodiment) in the semiconductor memory device according to an embodiment of the present invention.

A sidewall memory cell of a semiconductor memory device in a fifth embodiment has a substantially similar configuration to that of the second embodiment except that an SOI substrate is used as the semiconductor substrate in the second embodiment as shown in FIG. 15.

In the sidewall memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the sidewall memory cell as well, action and effect similar to those of the sidewall memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
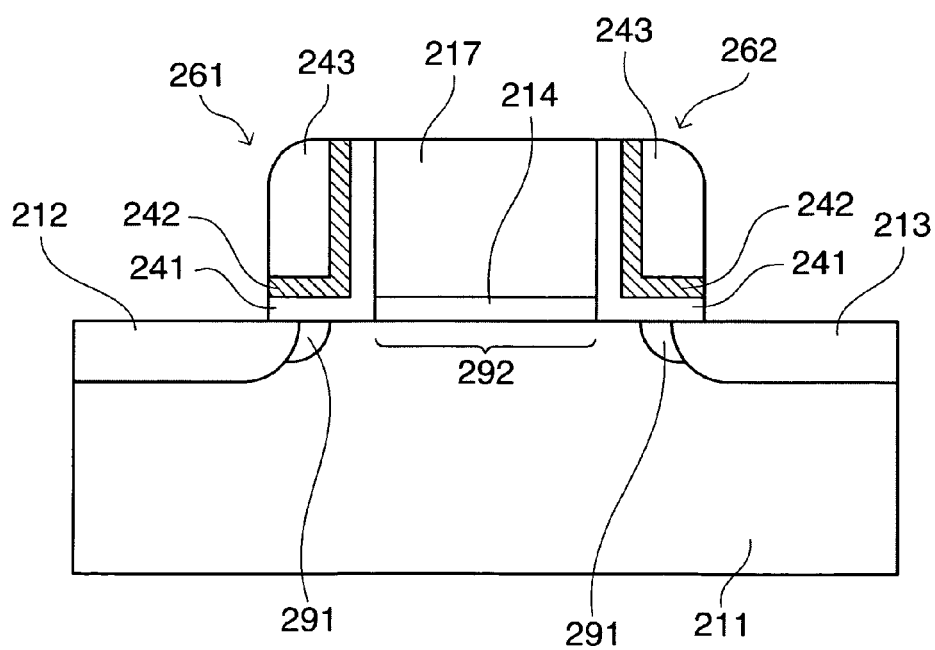
FIG. 16 is a schematic sectional view showing a main part of a memory cell (sixth embodiment) in the semiconductor memory device according to an embodiment of the present invention.

A sidewall memory cell in a semiconductor memory device in a sixth embodiment has, as shown in FIG. 16, a configuration substantially similar to that of the sidewall memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the sidewall memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
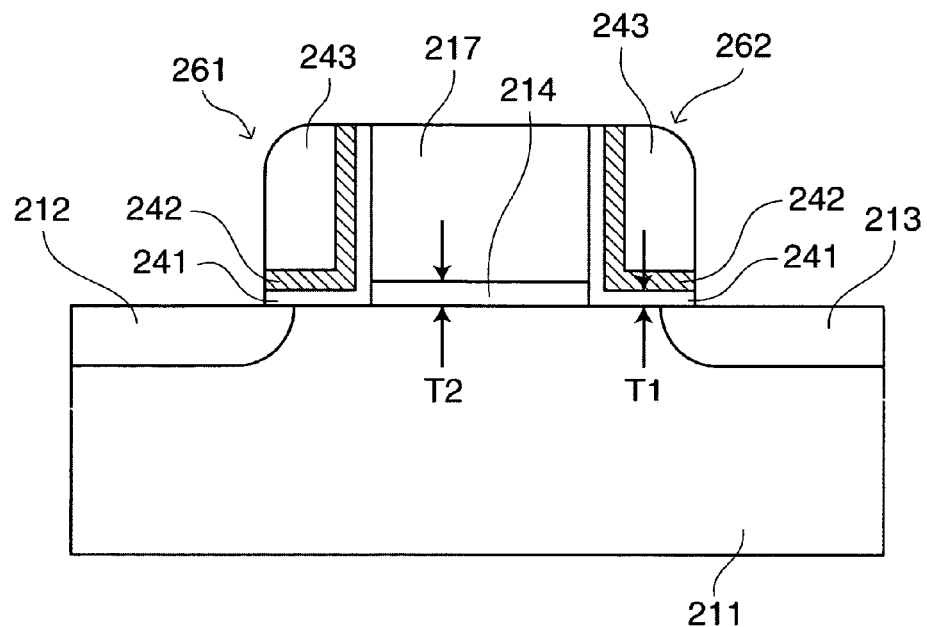
FIG. 17 is a schematic sectional view showing a main part of a memory cell (seventh embodiment) in the semiconductor memory device according to an embodiment of the present invention.

A sidewall memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the sidewall memory cell for the following reason.

In the sidewall memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the sidewall memory cell is inhibited.

As should be apparent from the above, by setting T1<T2, without deteriorating the withstand voltage performance of the memory, the voltage of the writing and erasing operations is decreased, or the writing operation and erasing operation are performed at high speed and, further, the memory effect can be increased.

More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting the nonvolatile memory of the present invention as a nonvolatile memory for image adjustment on the liquid crystal driver LSI, in the sidewall memory cell, the thickness of the insulating film separating the charge retaining film (silicon nitride film 242) and the channel region or well region can be designed optimally independently of the thickness of the gate insulating film. For example, the thickness can be individually set as T1=20 nm and T2=10 nm for a sidewall memory cell having a gate electrode length (word line width) of 250 nm, so that a sidewall memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
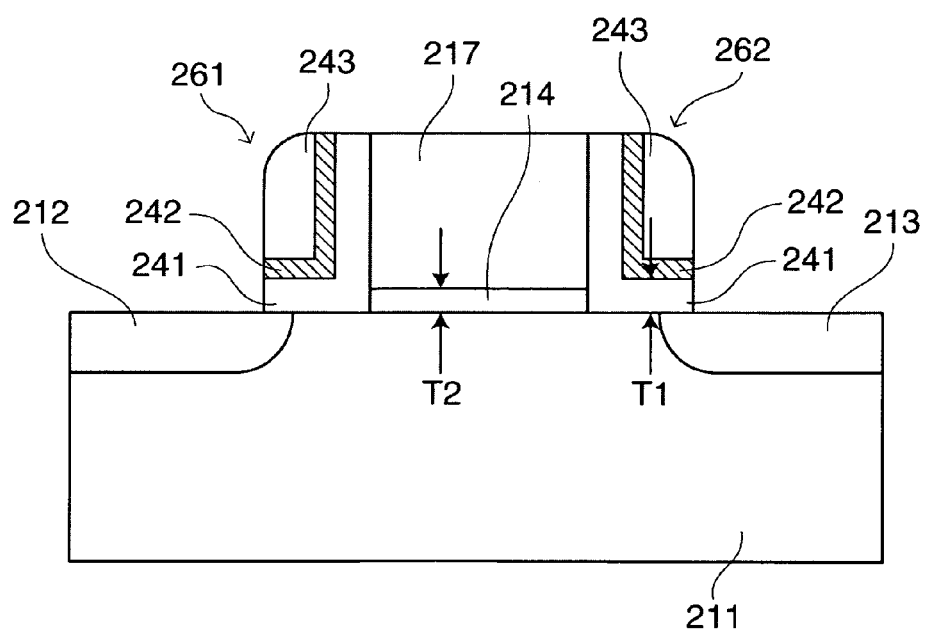
FIG. 18 is a schematic sectional view showing a main part of a memory cell (eighth embodiment) in the semiconductor memory device according to an embodiment of the present invention.

A sidewall memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the sidewall memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the sidewall memory cell, since T1 and T2 can be individually designed as described above, size reduction is made possible.

For example, for a sidewall memory cell having a gate electrode length (word line width) of 45 nm, T2=4 nm and T1=7 nm are individually set, and a sidewall memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the sidewall memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the sidewall memory cell having a gate length which is reduced to be equal to or less than the gate length of a logic transistor of the same process generation can be realized.

Ninth Embodiment

A ninth embodiment relates to a change in the electric characteristic at the time of rewriting a sidewall memory cell of a semiconductor memory device.

Figure 19:
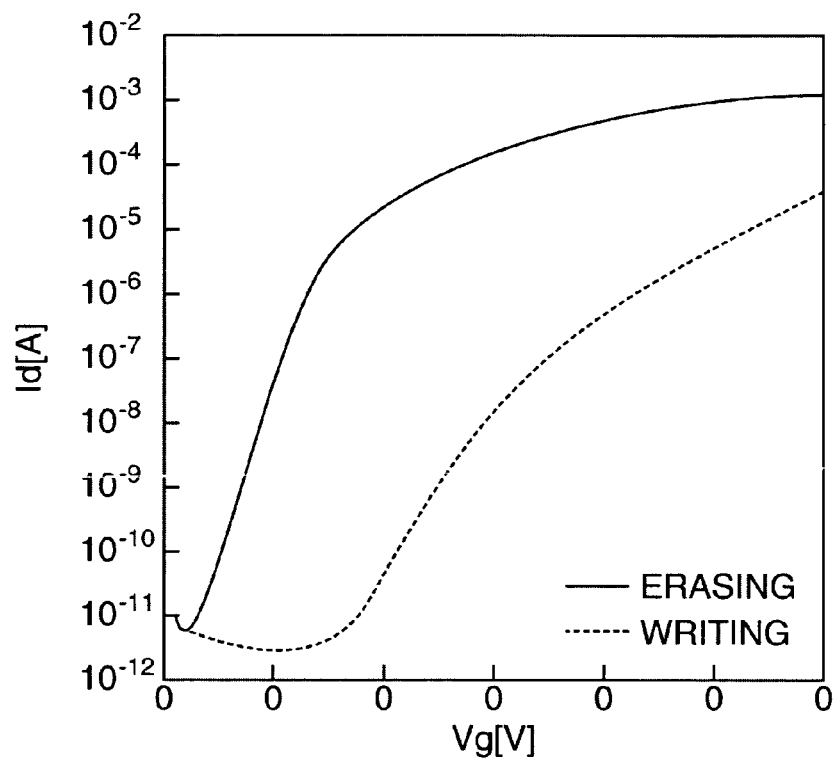
FIG. 19 is a graph showing electric characteristics of a memory cell (ninth embodiment) in the semiconductor memory device according to an embodiment of the present invention.

In an N-channel type sidewall memory cell, when an amount of charges in a memory functional unit changes, a drain current (Id)-gate voltage (Vg) characteristic (actual measurement value) as shown in FIG. 19 is exhibited.

Figure 22:
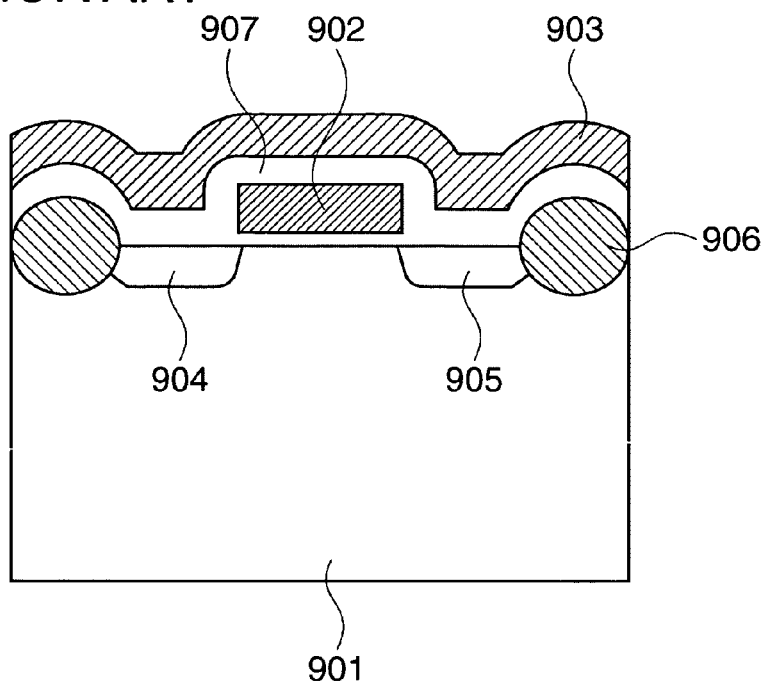
FIG. 22 is a schematic sectional view showing a main part of a conventional flash memory.
Figure 23:
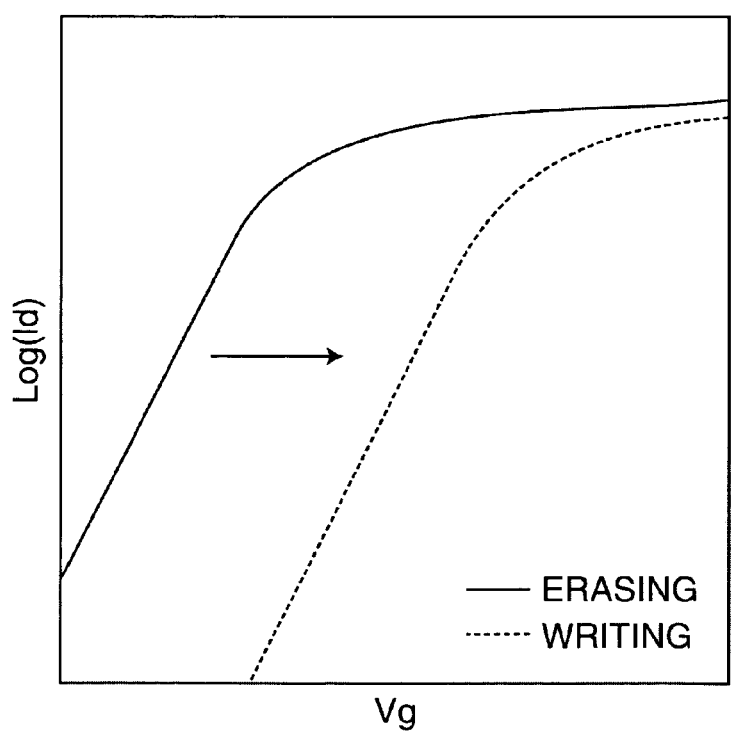
FIG. 23 is a graph showing electric characteristics of a conventional flash memory.

As obvious from FIG. 19, in the case of performing a writing operation in an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 22).

Appearance of such a characteristic is a peculiar phenomenon which occurs since the gate electrode and the diffusion region are offset from each other, and the gate electric field does not easily reach the offset region. When the sidewall memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the sidewall memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As will be understood from the above, in the sidewall memory cell in the semiconductor memory device of an embodiment of the present invention, the drain current ratio between the writing operation and the erasing operation can be particularly made high.

Tenth Embodiment

A tenth embodiment relates to a semiconductor memory device in which a plurality of sidewall memory cells (hereinafter, simply referred to as memory cells in the embodiment) according to any of the first to ninth embodiments are arranged and, further, to a programming verification method of the nonvolatile cells in the semiconductor memory device.

In the following various examples, in programming and sensing of a memory cell which has two possible states, reference memory cells for verifying programming are used. Each reference memory cell for verifying programming is set so as to have a threshold voltage Vt which specifies the boundary of the possible states of a selected memory cell. In the example, a single reference memory cell for verifying programming is used to specify a threshold voltage. The memory functional unit of a selected memory cell has to be programmed so as to pass a writing verifying test when the voltage of the memory functional unit exceeds the threshold voltage. Therefore, in the example, the reference memory cell for verifying programming is used for verifying an analog voltage level Vt of the selected memory cell.

Figure 24:
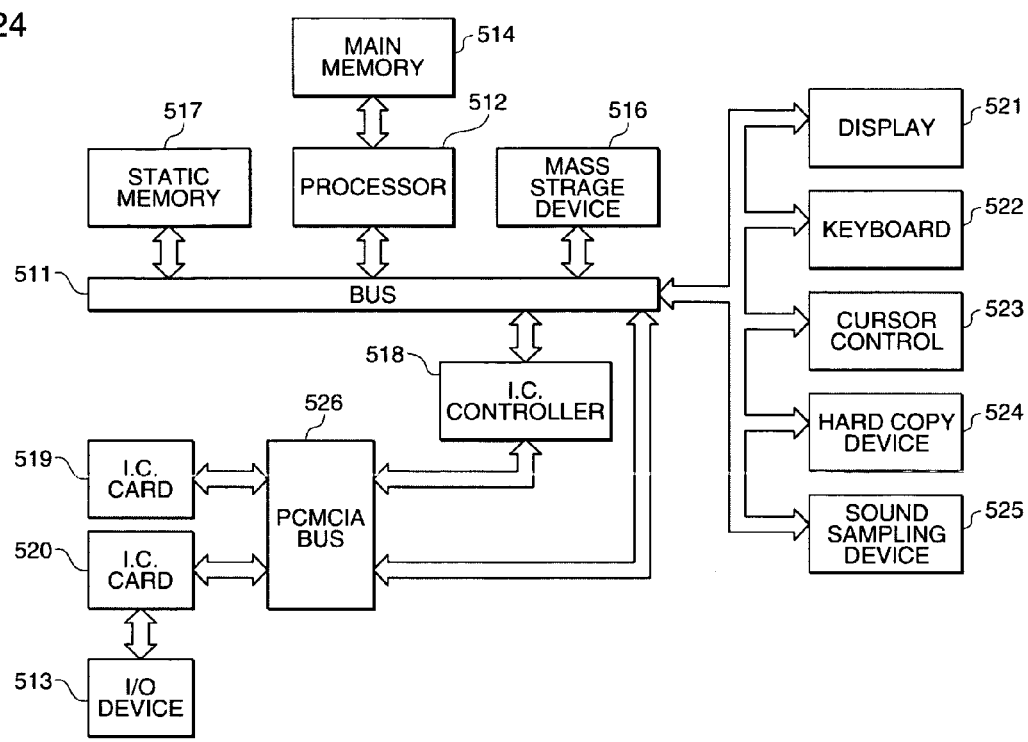
FIG. 24 is a block diagram showing a computer system of a semiconductor memory device (tenth embodiment) according to an embodiment of the present invention.
Figure 25:
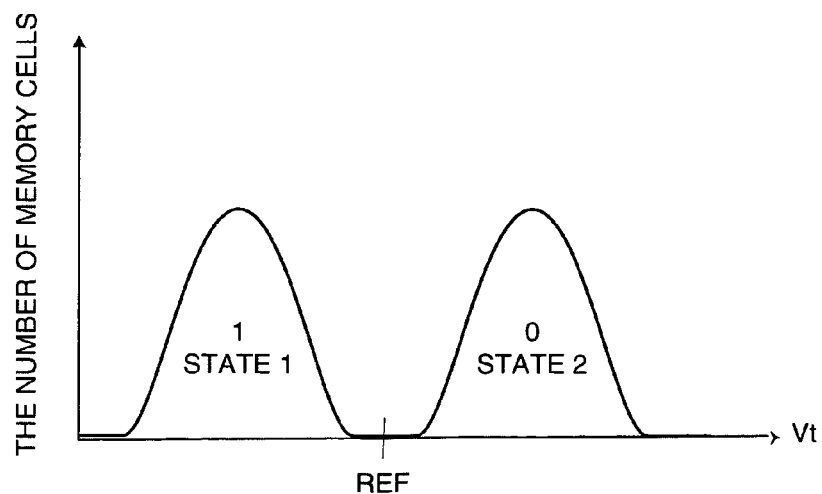
FIG. 25 is a graph showing distribution of threshold voltages in a writing state and an erasing state of a memory cell in the semiconductor memory device (tenth embodiment) according to an embodiment of the present invention.

FIG. 24 shows a computer system as an example. The computer system has a bus 511. To the bus 511, a processor 512, a main memory 514, a static memory 516, a mass storage device 517 and an integrated circuit (IC) controller 518 are connected. The static memory 516 has memory cells of the present invention.

IC cards 519 and 520 are provided in the computer system and are connected to a personal computer memory card industry (PCMCIA) bus 526. The PCMCIA bus 526 is connected to the bus 511 and the integrated circuit (IC) controller 518 and provides information between the IC cards 519 and 520 and the rest of the computer system. The IC controller 518 gives control information and address information to the IC cards 519 and 520 via the PCMCIA bus 526.

The computer system further has a display device 521, a keyboard 522, a cursor control device 523, a hard copy device 524 and a sound sampling device 525. Specific elements and modes of the computer system are determined in accordance with a specific application using the computer system. For example, the computer system of FIG. 24 is a personal digital assistant (PDA), a pen-based computer system, a main frame computer or a personal computer.

The memory cell of the present invention having the memory functional units functions as a field effect transistor having the threshold voltage Vt which increases as charges are applied to the memory functional units. The drain current Id (cell current) of the memory cell decreases as the threshold voltage Vt and the charge level of the memory cell increase. The relation between the threshold voltage Vt of the memory cell and the drain current Id of the memory cell is expressed by the following expression:

$$Id \propto Gm \times (Vg-Vt), \text{ provided that } Vd > Vg-Vt,$$

wherein Gm denotes mutual conductance of memory cell,
Vg denotes gate voltage of memory cell,
Vd denotes drain voltage of memory cell, and
Vt indicates threshold voltage of memory cell.

When the relation is given, a plurality of methods for sensing an amount of charges stored in the memory functional unit in the memory cell exist, and one of the methods will be described as follows. The method has the steps of: sensing cell current of a memory cell when predetermined voltage is applied to a selection gate of the memory cell; sensing a voltage value necessary for the selection gate to generate expected cell current for the memory cell; sensing a voltage drop at both ends of a load connected to the drain of the memory cell when a predetermined voltage is applied to the selection gate of the memory cell; determining an amount of the voltage drop at both ends of the load by the cell current; and sensing a voltage value necessary for the selection gate to cause an expected voltage drop at both ends of the load connected to the drain of the memory cell. However, it is unnecessary to accurately determine charges stored in the memory functional unit in order to determine the analog state of the memory cell. It is sufficient to compare the characteristic of the memory cell with a known reference value.

Figure 26:
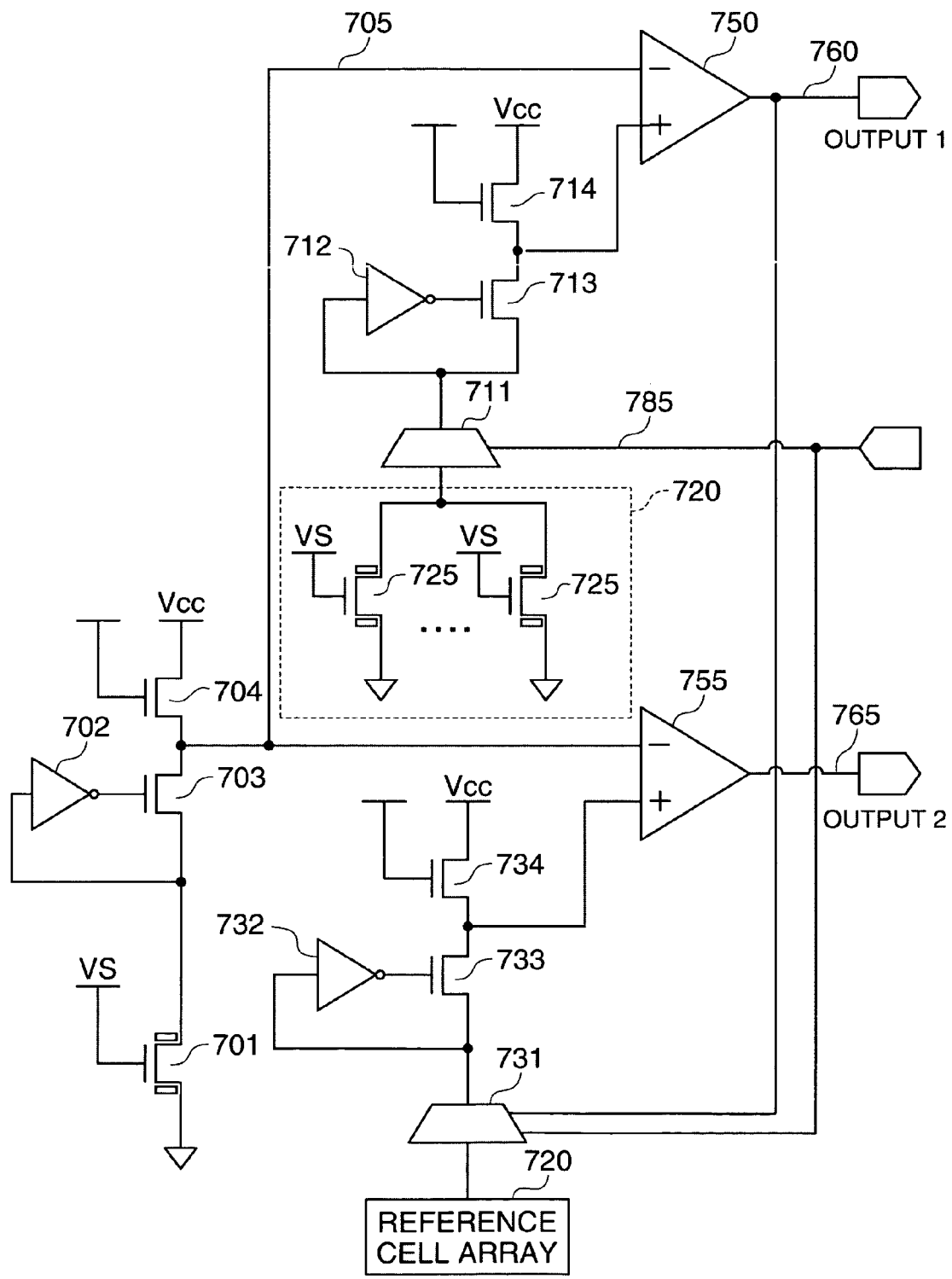
FIG. 26 is a circuit diagram showing a sense circuit for determining the state of the memory cell having two possible states in the semiconductor memory device (tenth embodiment) according to an embodiment of the present invention.

FIG. 26 shows a sense circuit for determining the state of the memory cell. The circuit uses a predetermined gate voltage/variable cell current sensing scheme. According to the scheme, the predetermined bias voltage Vs is applied to the selection gates of a selected memory cell 701 and a reference memory cell 725. The state of the selected memory cell 701 is determined by comparing the cell current of the selected memory cell 701 as a function of the charge level of the memory functional unit in the memory cell 701 with the reference cell current of the reference memory cell 725. A load is connected to the drain of each of the memory cells in order to sense the cell current, and a voltage drop occurs. In such a manner, the memory charge level of the selected memory cell is sensed and used to determine the analog state of the selected memory cell.

The state of the selected memory cell determines the voltage of a node 705. The node is the drain of an FET 703. A negative terminal of a comparator 750 is connected to the node 705, and a voltage generated by applying a bias voltage Vs to the selection gate of the selected memory cell 701 is sensed. When the bias voltage Vs is applied, the cell current of the memory cell 701 is made conductive. The charge level of the memory functional unit of the selected memory cell 701 is indicated by Vt of the selected memory cell and determines the amount of the cell current. When Vt increases, the cell current decreases. On the contrary, when Vt decreases, the cell current increases. Therefore, in the case where the selected memory cell 701 is in the state 1, the voltage of the node 705 is lower than that in the case where the selected memory cell 701 is in the state 2.

The comparator 750 has a positive terminal connected to a first reference circuit. The first reference circuit has a drain bias circuit including a load FET 714, an inverter 712 and an FET 713, and selected one of the reference memory cells 725 of a reference cell array 720 having a plurality of reference memory cells each having a predetermined threshold voltage Vt. The selection is made by a selection circuit 711 in accordance with the state of a control signal line 785. The voltage of a node 715 is determined by the cell current of the reference memory cell 725 selected by the selection circuit 711. The positive terminal of the comparator 755 is connected to a second reference circuit. The second reference circuit has a drain bias circuit including a load FET 734, an FET 733 and an inverter 732, and a selected memory cell in the reference cell array 720 having the reference memory cells 725. The various reference memory cells 725 are selected by a selection circuit 731 in accordance with a control signal from the signal line 785. Preferably, column load FETs 714 and 734 of the reference circuits are the same as a column bias FET 704. Similarly, a drain bias circuit is preferably the same as an inverter 702 and the FET 703. Each of the first and second reference circuits can have an independent reference cell array 720 or the first and second reference circuits can share a single reference cell array 720. In one of methods, the single reference cell array 720 to be used is provided by all of sense circuits of the memory device.

Figure 27:
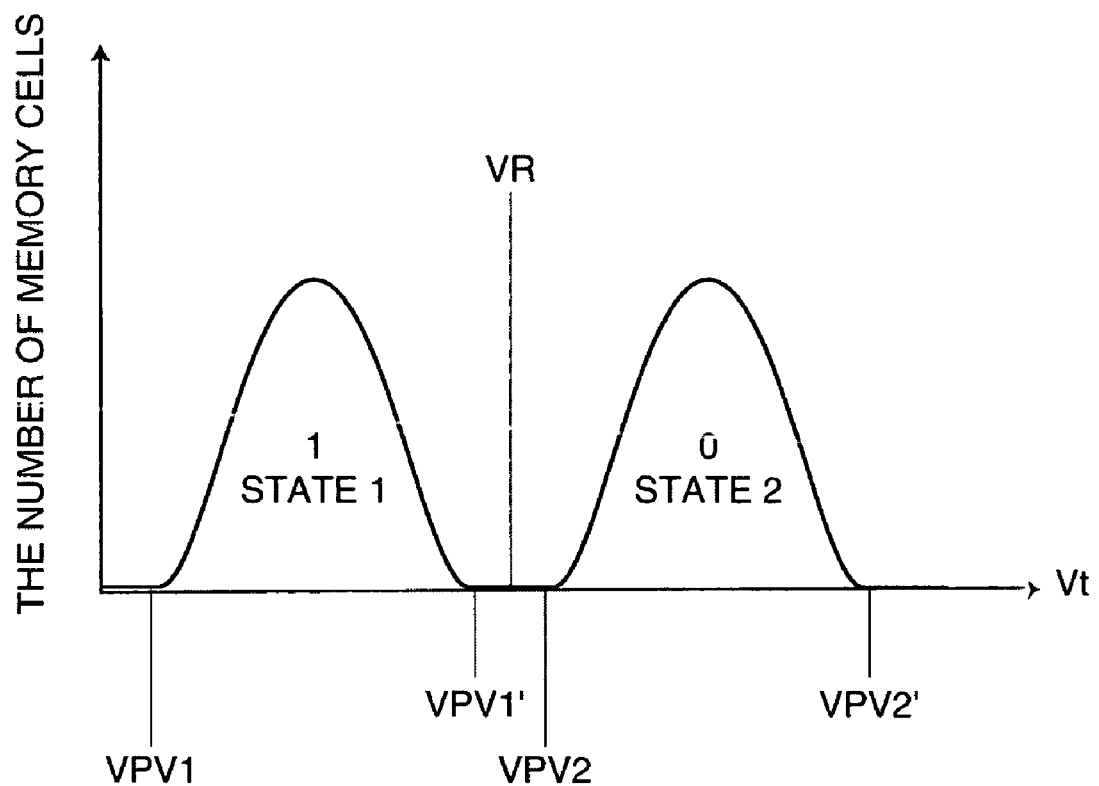
FIG. 27 is a graph showing distribution of a threshold voltage of a memory cell in the semiconductor memory device (tenth embodiment) according to an embodiment of the present invention.

The value Vt of the reference cell in FIG. 26 will be described below with reference to FIG. 27. FIG. 27 expresses the distribution of memory cells as functions of Vt. The reference cell array 720 has five reference memory cells 725 in a specific example. Each of the reference memory cells 725 has a memory functional unit which is set to new Vt shown in FIG. 27. Possible Vt voltages of the reference memory cell 725 include a read reference voltages (R voltages) VR and program verification (PV) voltages VPV1, VPV2 VPV1' and VPV2'.

Each of the PV voltage level with a dash and the PV voltage level without a dash is a program verification voltage which defines the outer side boundary of the range of the Vt voltage specifying a single state. The PV level without a dash specifies a lower boundary, and the PV level with a dash specifies a higher boundary. Therefore, VPV2 specifies the minimum Vt value at which the memory cell can be in the state 2, and VPV2' specifies the maximum Vt value at which the memory cell can be in the state 2. The PV reference memory cell is used to guarantee the existence of the separation range for accurately determining data to be stored in the memory array. The voltage level expressed by VR is a standard read reference voltage set in the separation ranges of the state.

As shown in FIG. 26, in the standard reading process, the selection circuit 711 selects the reference memory cell having Vt which is equal to VR. The selection circuit 731 and the comparator 755 are not used in the reading process.

The state of the signal line 785 becomes important in the write verification process. When the programming pulse is applied to a selected memory cell, the control engine 680 senses the state of the selected memory cell, thereby performing the write verification process. The process is performed by reading data stored in the selected memory cell by using a selected PV reference memory cell and comparing the result of the reading process with expected data for the memory cell. This is created as a "random data sense" write verification scheme. The state of the selected memory cell can be determined by comparing the analog Vt voltage level of the selected memory cell with that of the selected PV reference memory cell without a dash. This is created as a "level verification" write verification scheme.

Figure 28:
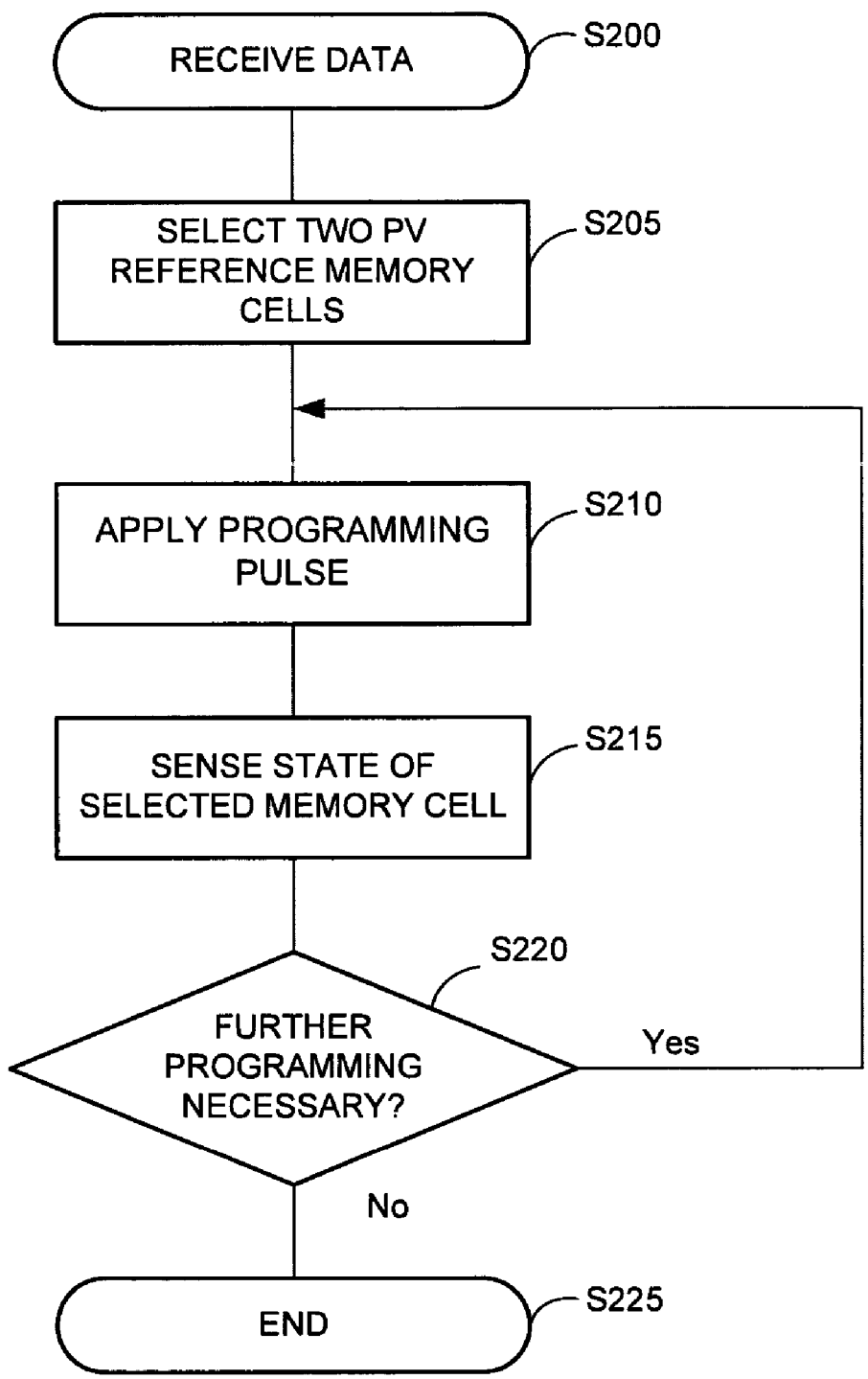
FIG. 28 is a flowchart showing another method for performing a writing verification process on a plurality of bit memory cells in the semiconductor memory device (tenth embodiment) according to an embodiment of the present invention.

A method of performing the write verifying process on a memory cell is shown in FIG. 28. The write verifying process is a level verification scheme combined with an over-program sense scheme. When a writing process starts in step S200, data is received by the control engine via an input buffer. The control engine encodes the data and outputs a proper programming level as described above. In step S205, the control engine 680 selects two PV reference memory cells via the signal line 785. One PV reference cell is selected for each of the comparators 750 and 755. A first PV reference cell connected to the comparator 750 is a PV without a dash indicative of a certain state, that is a memory cell having a lower-limit threshold value, and a second PV reference cell connected to the comparator 755 is a PV memory cell with a dash indicative of the same state, that is a memory cell having an upper-limit threshold value. For example, if data to be programmed is "0", the selected memory cell has to be programmed into the state 2, so that the comparator 750 has a positive terminal connected to the reference memory cell having Vt of VPV2 via the FET 713 and the selection circuit 711. The comparator 755 has a positive terminal connected to the reference memory cell having Vt of VPV2' via the FET 733 and the selection circuit 731. The comparator 750 is connected only to the PV reference memory cell without a dash, and the comparator 755 is connected only to the PV reference memory cell with a dash, so that expected outputs of the comparators are the same irrespective of the state of the selected memory cell as shown in Table 1.

TABLE 1

| Level | Reference value of comparator 750 | Reference value of comparator 755 | Output of comparator 750 at the time of path programming | Output of comparator 755 at the time of path programming |
|---|---|---|---|---|
| State 1 | VPV1 | VPV1' | 0 | 1 |
| State 2 | VPV2 | VPV2' | 0 | 1 |

In step S210, a programming pulse is applied to the selected memory cell for a predetermined period. In step S215, the state of the selected memory cell is sensed and compared with an expectation value "0". In the case where the sensed data has the logic value "1" in outputs of two comparators, programming is further requested and step S210 is repeated. When it is sensed that an output of the comparator 750 has changed from the logic value 1 to 0, the programming stops in step S225. The process determining block is expressed as step S220. In the case where the output of the comparator 755 is the logic value 0, the memory cell is over-programmed, so that it does not pass the write verification test. The method of FIG. 28 guarantees that insufficient programming or over-programming does not occur. Since injection of excessive charges into the memory functional units is accordingly suppressed, time longer than time necessary for the erasing operation is not consumed by injected excessive charges.

Figure 29:
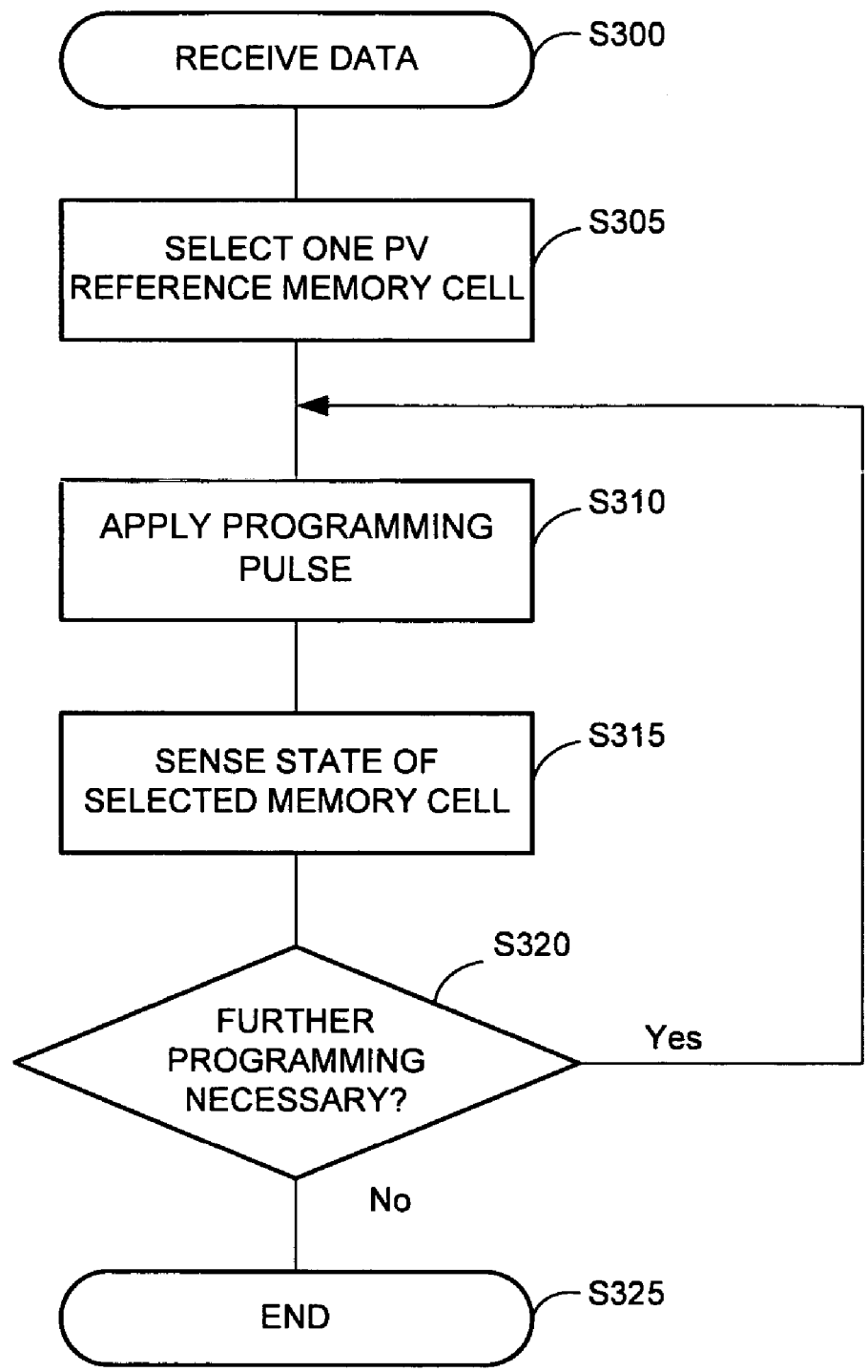
FIG. 29 is a flowchart showing still another method for performing the writing verification process on the plurality of bit memory cells in the semiconductor memory device (tenth embodiment) according to an embodiment of the present invention.

FIG. 29 shows another method of the write verifying process. In the method, the write verifying process is performed by using a single reference cell without a dash. External data is received and stored (step S300). A lower boundary PV reference cell for a desired state is selected via the signal line 785 (step S305). Step S310 is the same as step S210 in FIG. 28. In step S315, data of the selected memory cell is verified by monitoring an output of the comparator 750. In step S320, the control engine determines whether additional programming is necessary for the selected memory cell or not. In the case where an output of the comparator 750 shows that the selected memory cell has Vt lower than the program verification voltage of the PV reference memory cell, it is necessary to further perform the programming. When the sensed Vt value of the selected memory cell becomes larger than that of the reference memory cell, the programming is stopped in step S325. Table 2 shows expected outputs of the comparator 750 to finish the programming of the embodiment. In the case where connection of the selected memory cell and the reference memory cell to the comparator 750 becomes opposite, the selected memory cell is connected to the positive terminal and the reference memory cell is connected to the negative terminal, an expected output is the logic value 1.

TABLE 2

| Level | Reference value of comparator 750 | Output to finish programming |
|---|---|---|
| State 1 | VPV1 | 0 |
| State 2 | VPV2 | 0 |

Figure 30:
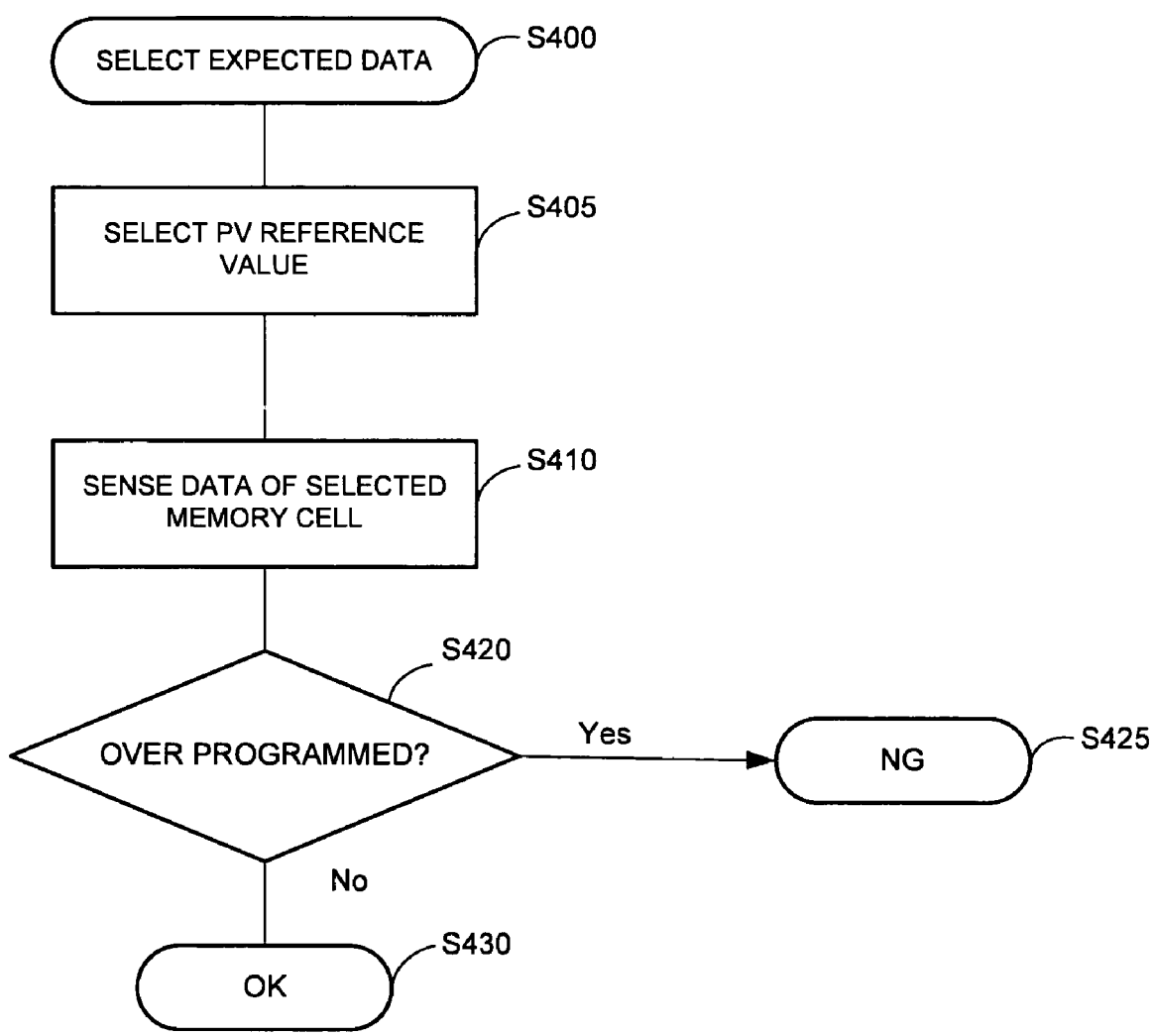
FIG. 30 is a flowchart showing a method of an over-programming sensing process in the programming verification method (tenth embodiment) according to an embodiment of the present invention.

The PV reference memory cell is also used for another application. For example, as shown in FIG. 30, the PV reference memory cell is used to perform an over-programming sensing process to determine whether a selected memory cell is over-programmed or not. In step S400, the expected data is received by the control engine, and the control engine selects a proper PV reference value with a dash corresponding to the upper boundary of the desired state. The data of the memory cell is sensed by using the PV reference memory cell with a dash (step S410). In step S420, the control engine 680 determines whether the selected memory cell is over-programmed or not. When an output of the comparator 755 indicates that the sensed Vt of the selected memory cell is larger than Vt of the PV reference memory cell with a dash, it is determined in step S425 that the selected memory cell is over-programmed. When an output of the comparator 750 indicates that the sensed Vt of the selected memory cell is smaller than Vt of the PV reference memory cell with a dash, the selected memory cell is properly programmed and passes the over-programming sensing test. In the embodiment, when an output of the comparator 750 is the logic value 1, the selected memory cell passes the test. When an output of the comparator 750 is the logic value 0, the selected memory cell does not pass the test. When the selected memory cell and the reference memory cell are connected to the comparator 750 in a manner opposite to the above, the memory cell indicating the logic value 0 passes the test.

Figure 31:
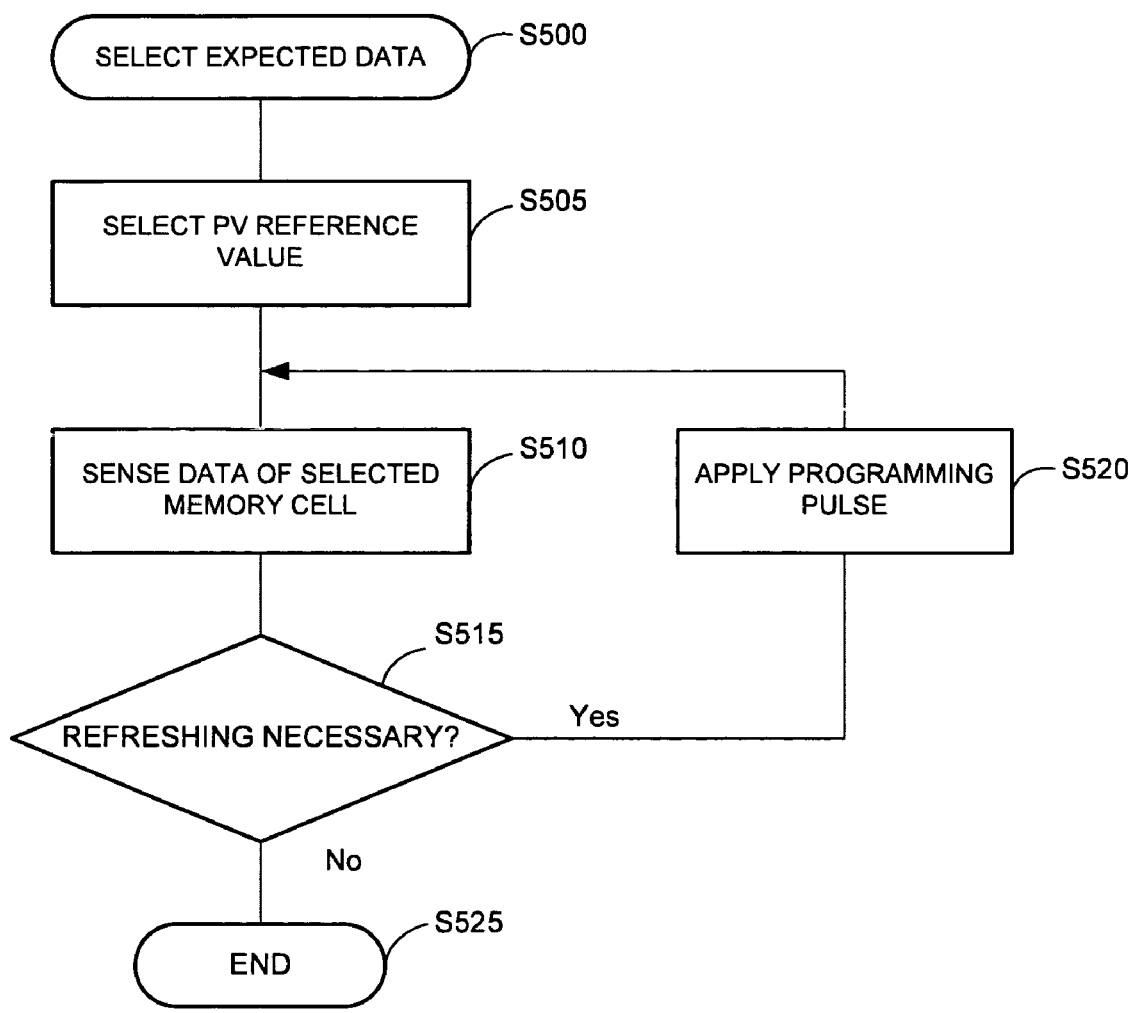
FIG. 31 is a flowchart showing refreshing method of a memory cell in the semiconductor memory device (tenth embodiment) according to an embodiment of the present invention.

FIG. 31 is a flowchart showing a method of refreshing a memory cell according to an embodiment. As time elapses, there is the possibility in that a charge loss occurs in a memory functional unit of a memory cell due to leakage, and Vt of the memory cell does not exist in the boundaries of program states specified by a PV reference voltage with a dash and a PV reference voltage without a dash. There is also the possibility in that the memory cell passes the first write verifying test by mistake and does not pass the next write verifying test. To deal with the problems, a refresh mechanism is provided. Expected data is received by the control engine (step S500). Like the write verifying method, the refreshing method is performed by using one or two PV reference memory cells. In the case of using one reference memory cell, preferably, the reference memory cell is a PV reference memory cell without a dash as a lower boundary of a desired state. In the case of using two reference cells, a read reference memory cell of a separation range lower than the desired state and a PV reference cell without a dash of the desired state are used. A proper reference memory cell is selected in step S505. In step S510, data of the selected memory cell is verified. In step S515, the control engine determines whether refreshing is necessary for the selected memory cell or not. In the case where an output of the comparator connected to the PV reference memory cell without a dash is the logic value 1, refreshing is necessary, and a programming pulse is applied to the selected memory cell (step S520). When an output of the comparator connected to the PV reference memory cell without a dash is the logic value 0, refreshing is unnecessary, and the refreshing process is finished (step S525).

The memory cell includes a gate electrode formed on a semiconductor layer via a gate insulating film, a channel region disposed under the gate electrode, diffusion regions disposed on both sides of the channel region, and memory functional units formed on both side of the gate electrode and having the function of retaining charges. Consequently, a forming process has high affinity with that of a normal transistor, and a memory cell can be easily formed together with peripheral circuits such as a sense circuit and an address decoder using a normal transistor, and another logic circuit.

In the embodiment, the case of using only one of the memory functional units has been described. A memory cell transistor according to an embodiment of the present invention has independent memory functional units on the right and left sides of the gate. By interchanging the source electrode and the drain electrode, two different kinds of information can be stored in one transistor. Therefore, for example, by providing means for interchanging the source electrode and the drain electrode of the memory cell 701 of FIG. 26, two pieces of data can be stored per one memory cell transistor.

Since the memory functional unit of the memory cell includes a charge retaining film extending almost in parallel with a side face of the gate electrode as described in the third embodiment, charges injected to the memory functional unit increases and rewriting speed increases. As described in the embodiment, the verifying operation for determining whether writing has succeeded or not is performed. In the case where a desired result is not obtained, the writing operation is repeated. Since the speed of the writing operation itself is high, a penalty is sufficiently small.

The memory cell has, as described in the seventh embodiment, a film having the surface almost parallel with the surface of the gate insulating film and having the function of retaining charges, and an insulating film which separates the film from the channel region or the semiconductor layer. The thickness of the insulating film is smaller than that of the gate insulating film and is 0.8 nm or more. Consequently, injection of charges to the memory functional unit is facilitated, and the writing operation can be performed at high speed. As described in the embodiment, the verifying operation of determining whether writing has succeeded or not is performed. In the case where a desired result is not obtained, the writing operation is repeated. Since the speed of the writing operation itself is high, a penalty is sufficiently small.

The memory functional unit of the memory cell further includes a film having the surface almost parallel with the surface of the gate insulating film and having the function of retaining charges. Therefore, variations in the memory effect can be suppressed. Consequently, in the verifying operation of determining whether writing has succeeded or not described in the embodiment, the probability of determining success increases. In the writing operation including the verifying operation, the number of determinations of verification can be decreased, so that the number of writing a memory cell can be reduced, the writing operation as a whole can be performed at higher speed, and power can be reduced.

Eleventh Embodiment

Figure 20:
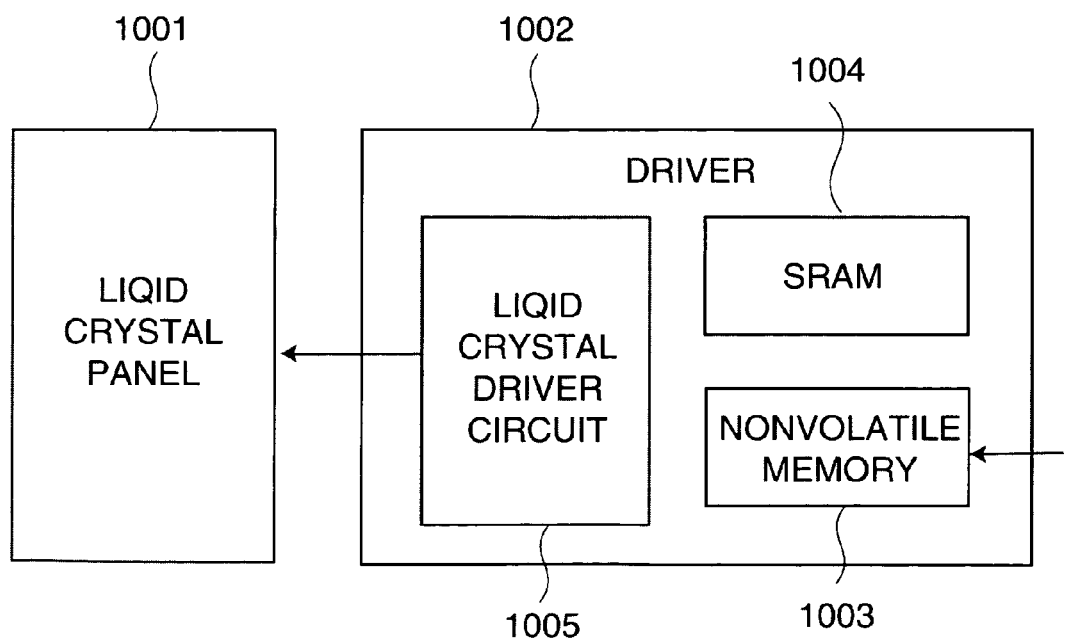
FIG. 20 is a schematic configuration diagram showing a liquid crystal display device (eleventh embodiment) incorporating therein the semiconductor memory device according to an embodiment of the present invention.

As an application example of the semiconductor memory device, for example, as shown in FIG. 20, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the sidewall memory cell of the present invention, more preferably, any of the semiconductor memory devices of the first to ninth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 20 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the sidewall memory cell. Particularly, it is preferable to use any of the semiconductor memory devices of the seventh to ninth embodiments in which sidewall memory cells of the present invention are integrated.

Twelfth Embodiment

Figure 21:
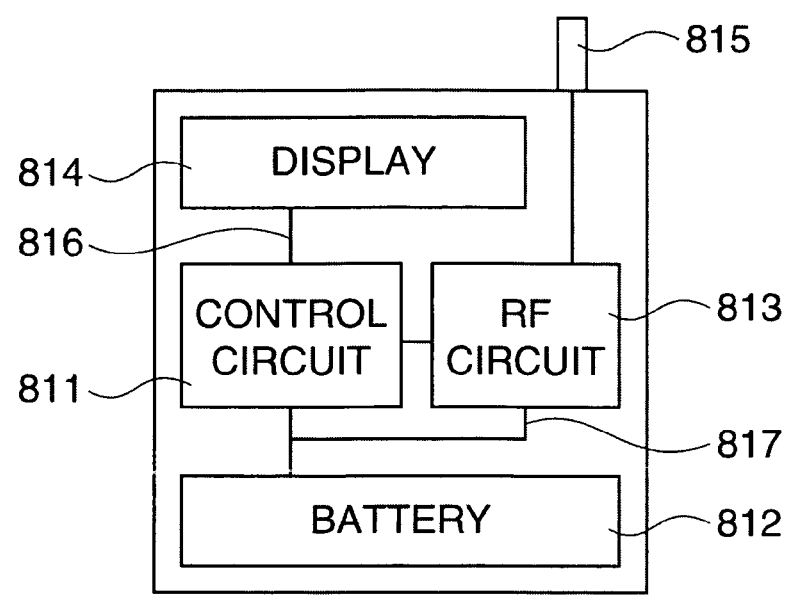
FIG. 21 is a schematic configuration diagram showing a portable electronic apparatus (twelfth embodiment) incorporating therein the semiconductor memory device according to an embodiment of the present invention.

FIG. 21 shows a cellular telephone as a portable electronic apparatus incorporating the above-described semiconductor memory device.

The cellular telephone is mainly constructed by a control circuit 811, a battery 812, an RF (Radio Frequency) circuit 813, a display 814, an antenna 815, a signal line 816 and a power source line 817. The control circuit 811 incorporates therein the above-described semiconductor memory device according to the present invention. Herein, the control circuit 811 is preferably an integrated circuit, in which devices of the same configuration serve as a memory circuit device and a logic circuit device as described in the tenth embodiment. Consequently, the integrated circuit can be easily fabricated, and thus, the fabrication cost of the portable electronic apparatus can be remarkably reduced.

In this manner, it is possible to increase the operation speed of the portable electronic apparatus and reduce the fabrication cost, so as to provide the inexpensive portable electronic apparatus having high reliability and high performance by using, for the portable electronic apparatus, the semiconductor memory device which facilitates the combination process between a memory and a logic circuit and achieves a reading operation at a high speed.

According to embodiments of the present invention, at the time of programming a nonvolatile memory cell, the method includes the steps of:

selecting first and second references corresponding to first and second voltages specifying a lower limit and an upper limit, respectively, of a threshold voltage level within a predetermined range indicative of a desired state;

applying a programming voltage to the nonvolatile memory cell;

sensing a threshold voltage level of the nonvolatile memory cell; and comparing the sensed threshold voltage level of the nonvolatile memory cell with the first and second references and, in the case where the threshold voltage level of the nonvolatile memory cell is higher than the first reference and lower than the second reference, indicating that the nonvolatile memory cell is programmed in the desired state. Consequently, it can be verified that a memory cell having two possible states is written in a desired state without being under-programmed or over-programmed.

According to embodiments of the present invention, at the time of programming a nonvolatile memory cell, the method includes the steps of:

selecting a first reference specifying a lower limit of a threshold voltage level within a predetermined range for indicating a desired state;

applying a programming voltage to the nonvolatile memory cell;

sensing a threshold voltage level of the nonvolatile memory cell; and comparing the sensed threshold voltage level of the nonvolatile memory cell with the first reference and, in the case where the threshold voltage level of the nonvolatile memory cell is higher than the first reference, indicating that the nonvolatile memory cell is programmed in the desired state. Consequently, it can be verified that a memory cell having two possible states is written in a desired state.

In the nonvolatile memory cell as a component of the semiconductor memory device, a memory function of the memory functional unit and a transistor operation function of the gate insulating film are separated from each other. Consequently, it is easy to suppress the short channel effect by thinning the gate insulating film while remaining the sufficient memory function. Further, a value of current flowing between the diffusion regions by rewriting changes larger as compared with the case of an EEPROM. Therefore, it facilitates discrimination between the writing state and the erasing state of the semiconductor memory device.

Further, the nonvolatile memory cell can be formed by a process which has very high affinity with a normal transistor forming process on the basis of the configuration. Therefore, as compared with the case of using a conventional flash memory as a nonvolatile memory cell and forming the memory cell together with a peripheral circuit which is usually made by a transistor, the number of masks and the number of processes can be dramatically reduced. Consequently, the yield of a chip on which the memory cell and the peripheral circuit are formed together can be improved. Because of this, the manufacturing cost is reduced, and a very-reliable, cheap semiconductor memory device can be obtained.

When the nonvolatile memory cell as a component of the semiconductor device is provided with a film which extends substantially parallel with a side face of the gate electrode and having the function of retaining charges, charges injected into the memory functional units increase and programming speed increases. Therefore, the writing operation of the entire semiconductor memory device can be increased, and power can be reduced. The verifying operation for determining whether writing has succeeded or not is performed. In the case where a desired result is not obtained, the writing operation is repeated. Since the speed of the writing operation itself is high, a penalty is sufficiently small.

The nonvolatile memory cell as a component of the semiconductor memory device is constructed to have a film having the surface substantially parallel with the surface of the gate insulating film and having the function of retaining charges, and an insulating film which separates the film from the channel region or the semiconductor layer. The thickness of the insulating film is larger than that of the gate insulating film and is 0.8 nm or more. Consequently, injection of charges to the memory functional unit is facilitated, and programming can be performed at high speed. Therefore, the speed of the writing operation of the entire semiconductor memory device can be increased and the power can be reduced. The verifying operation of determining whether writing has succeeded or not is performed. In the case where a desired result is not obtained, the writing operation is repeated. Since the speed of the writing operation itself is high, a penalty is sufficiently small.

By constructing the nonvolatile memory cell so as to include a film having the surface substantially parallel to the surface of the gate insulating film and having the function of retaining charges, variations in the memory effect can be suppressed, so that variations in programming time according to cells are suppressed. Therefore, the speed of the writing operation of the entire semiconductor memory device can be increased and power can be reduced. Consequently, in the verifying operation of determining whether writing has succeeded or not, the probability of determining success increases. In the writing operation including the verifying operation, the number of determinations of verification can be decreased, so that the number of writing a memory cell can be reduced, the writing operation as a whole can be performed at higher speed, and power can be reduced.

What is claimed is:

1. A method of verifying programming of a nonvolatile memory cell in a semiconductor memory device to a desired state, the semiconductor memory device including at least one nonvolatile memory cell having two possible states, each state corresponding to threshold voltage levels within a predetermined range, the nonvolatile memory cell holding a voltage level indicative of one of the two states, the method comprising the steps of:

selecting first and second references respectively corresponding to first and second voltages, the first and second voltages specifying a lower limit and an upper limit, respectively, of a voltage level within a predetermined range, the voltage level indicative of the desired state;

applying a programming voltage to the nonvolatile memory cell;

sensing a threshold voltage level of the nonvolatile memory cell; and comparing the sensed threshold voltage level of the nonvolatile memory cell with the first and second references and, in the case where the threshold voltage level of the nonvolatile memory cell is higher than the first reference and lower than the second reference, indicating that the nonvolatile memory cell is programmed into the desired state, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

2. The programming verification method according to claim 1, further comprising the steps of:

applying a programming voltage to the nonvolatile memory cell when the threshold voltage level of the nonvolatile memory cell is lower than the first reference;

comparing the threshold voltage level of the nonvolatile memory cell with the first and second references; and repeating the above steps in this order until the threshold voltage level of the nonvolatile memory cell becomes higher than the first reference.

3. The programming verification method according to claim 2, further comprising the step of:

indicating that the nonvolatile memory cell is over-programmed when the threshold voltage level of the nonvolatile memory cell is higher than the second reference.

4. The programming verification method according to claim 3, further comprising the step of:
receiving data, the data indicating that the nonvolatile memory cell is in the desired state, wherein the step of selecting the first reference and the step of selecting the second reference are performed in accordance with the received data.

5. The programming verification method according to claim 1, wherein the nonvolatile memory cell includes a film which extends substantially parallel with a side face of the gate electrode and has the function of retaining charges.

6. The programming verification method according to claim 1, wherein the nonvolatile memory cell includes (1) a film having a surface which extends substantially parallel with a surface of the gate insulating film and having the function of retaining charges, and (2) an insulating film for separating the film from the channel region or from the semiconductor layer, and wherein the thickness of the insulating film is larger than that of the gate insulating film and is 0.8 nm or more.

7. The programming verification method according to claim 1, wherein the nonvolatile memory cell includes a film having a surface substantially parallel with a surface of the gate insulating film and having the function of retaining charges.

8. A method of verifying programming of a nonvolatile memory cell in a semiconductor memory device to a desired state, the semiconductor memory device including at least one nonvolatile memory cell having two possible states, each state corresponding to threshold voltage levels within a predetermined range, the nonvolatile memory cell holding a voltage level indicative of one of the two states, the method comprising the steps of:
selecting a first reference, the first reference specifying a lower limit of a voltage level within a predetermined range, the voltage level for indicating the desired state;
applying a programming voltage to the nonvolatile memory cell;
sensing a threshold voltage level of the nonvolatile memory cell; and
comparing the sensed threshold voltage level of the nonvolatile memory cell with the first reference and, in the case where the threshold voltage level of the nonvolatile memory cell is higher than the first reference, indicating that the nonvolatile memory cell is programmed into the desired state,
wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

9. The programming verification method according to claim 8, further comprising the steps of:
applying a programming voltage to the nonvolatile memory cell;
comparing the threshold voltage level of the nonvolatile memory cell with the first reference; and,
in the case where the threshold voltage level of the nonvolatile memory cell is lower than the threshold voltage level of the first reference, repeating the above steps in this order until the threshold voltage level of the nonvolatile memory cell becomes higher than the first reference.

10. The programming verification method according to claim 8, wherein the nonvolatile memory cell includes a film which extends substantially parallel with a side face of the gate electrode and has the function of retaining charges.

11. The programming verification method according to claim 8, wherein the nonvolatile memory cell includes (1) a film having a surface which extends substantially parallel with a surface of the gate insulating film and having the function of retaining charges, and (2) an insulating film for separating the film from the channel region or from the semiconductor layer, and wherein the thickness of the insulating film is larger than that of the gate insulating film and is 0.8 nm or more.

12. The programming verification method according to claim 8, wherein the nonvolatile memory cell includes a film having a surface substantially parallel with a surface of the gate insulating film and having the function of retaining charges.

13. A method of verifying whether a nonvolatile memory cell in a semiconductor memory device is over-programmed, the semiconductor memory device including at least one nonvolatile memory cell having two possible states, each state corresponding to threshold voltage levels within a predetermined range, the nonvolatile memory cell holding a voltage level indicative of one of the two states, the method comprising the steps of:
selecting a first reference corresponding to a first voltage specifying an upper limit of a voltage level within a predetermined range, the voltage level for indicating the desired state;
sensing a threshold voltage level of the nonvolatile memory cell; and
comparing the sensed threshold voltage level of the nonvolatile memory cell with the first reference and, in the case where the threshold voltage level of the nonvolatile memory cell is higher than the first reference, indicating that the nonvolatile memory cell is over-programmed,
wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

14. The programming verification method according to claim 13, wherein the nonvolatile memory cell includes a film which extends substantially parallel with a side face of the gate electrode and has the function of retaining charges.

15. The programming verification method according to claim 13, wherein the nonvolatile memory cell includes (1) a film having a surface which extends substantially parallel with a surface of the gate insulating film and having the function of retaining charges, and (2) an insulating film for separating the film from the channel region or from the semiconductor layer, and wherein the thickness of the insulating film is larger than that of the gate insulating film and is 0.8 nm or more.

16. The programming verification method according to claim 13, wherein the nonvolatile memory cell includes a film having a surface substantially parallel with a surface of the gate insulating film and having the function of retaining charges.

17. A method of refreshing and setting a nonvolatile memory cell in a semiconductor memory device into a desired state, the semiconductor memory device including at least one nonvolatile memory cell having two possible states, each state corresponding to threshold voltage levels within a predetermined range, the nonvolatile memory cell holding a voltage level indicative of one of the two states, the method comprising the steps of:
  selecting a first reference, the first reference specifying a lower limit of a voltage level within a predetermined range, the voltage level for indicating the desired state;
  sensing a threshold voltage level of the nonvolatile memory cell;
  comparing the sensed threshold voltage level of the nonvolatile memory cell with the first reference; and
  applying a programming voltage to the nonvolatile memory cell, comparing the threshold voltage level of the nonvolatile memory cell with the first reference and, in the case where the threshold voltage level of the nonvolatile memory cell is lower than that of the first reference, sequentially repeating the above steps until the threshold voltage level of the nonvolatile memory cell becomes higher than the first reference,
  wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

18. A semiconductor memory device including at least one nonvolatile memory cell comprising a programming circuit for verifying programming, to a desired state, of a nonvolatile memory cell having two possible states, each state corresponding to threshold voltage levels within a predetermined range, the nonvolatile memory cell holding a voltage level indicative of one of the states, the semiconductor memory device comprising a programming circuit for verifying programming of the nonvolatile memory cell to a desired state, the programming circuit including:
  a plurality of read references corresponding to read voltages of the plurality of states, respectively;
  a first reference corresponding to a first voltage, the first voltage specifying a lower-limit value of the desired state;
  a second reference corresponding to a second voltage, the second voltage specifying an upper-limit value of the desired state;
  a control engine connected between the nonvolatile memory cell and the first and second references to apply a programming voltage to the nonvolatile memory cell for programming the nonvolatile memory cell into the desired state, to generate a selection signal for selecting the first and second references, and to sense the present state of the nonvolatile memory cell; and
  a sense circuit connected to the first and second references in accordance with the selection signal and connected to the nonvolatile memory cell and the control engine, the sense circuit for sensing the presently retained voltage of the nonvolatile memory cell, the sense circuit including:
    (i) a first comparator, connected to the nonvolatile memory cell, the control engine and the first reference, for comparing a threshold voltage level of the nonvolatile memory cell with the first reference and, in the case where the threshold voltage level of the nonvolatile memory cell is higher than the first reference, outputting a first result signal to the control engine; and
    (ii) a second comparator, connected to the nonvolatile memory cell, the control engine and the second reference, for comparing the threshold voltage level of the nonvolatile memory cell with the second reference and, in the case where the threshold voltage of the nonvolatile memory cell is lower than the second reference, outputting the second result signal to the control engine, the sense circuit indicating that the nonvolatile memory cell is programmed into the desired state from outputs of the first and second result signals of the first and second comparators,
  wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

19. The semiconductor memory cell according to claim 18, wherein each of the first and second references is a reference memory cell.

20. The semiconductor memory device according to claim 18, wherein the desired state comprises first and second values, and wherein the control engine compares the first result signal with the first value and, in the case where the first result signal is not equal to the first value, applies a programming voltage.

21. The semiconductor memory device according to claim 18, wherein the nonvolatile memory cell includes a film which extends substantially parallel with a side face of the gate electrode and has the function of retaining charges.

22. The semiconductor memory device according to claim 18, wherein the nonvolatile memory cell includes (1) a film having a surface which extends substantially parallel with a surface of the gate insulating film and having the function of retaining charges, and (2) an insulating film for separating the film from the channel region or from the semiconductor layer, and wherein the thickness of the insulating film is larger than that of the gate insulating film and is 0.8 nm or more.

23. The semiconductor memory device according to claim 18, wherein the nonvolatile memory cell includes a film having a surface substantially parallel with a surface of the gate insulating film and having the function of retaining charges.

24. A portable electronic apparatus comprising the semiconductor memory device according to claim 18.

25. A semiconductor memory device including at least one nonvolatile memory cell comprising a programming circuit for verifying programming, to a desired state, of a nonvolatile memory cell having two possible states, each state corresponding to threshold voltage levels within a predetermined range, the nonvolatile memory cell holding a voltage level indicative of one of the states, the semiconductor memory device comprising a programming circuit for verifying programming of the nonvolatile memory cell to a desired state, the programming circuit including:

a plurality of read references corresponding to read voltages of the plurality of states, respectively;

a first reference corresponding to a first voltage, the first voltage specifying a lower-limit value of the desired state;

a control engine connected between the nonvolatile memory cell and a second reference to apply a programming voltage to the nonvolatile memory cell for programming the nonvolatile memory cell into the desired state, to generate a selection signal for selecting the first reference, and to sense the present state of the nonvolatile memory cell; and a sense circuit connected to the first reference in accordance with the selection signal and connected to the nonvolatile memory cell and the control engine, sense circuit for sensing the presently retained voltage of the nonvolatile memory cell, the sense circuit including:

a first comparator, connected to the nonvolatile memory cell, the control engine and the first reference, for comparing a threshold voltage level of the nonvolatile memory cell with the first reference and, in the case where the threshold voltage level of the nonvolatile memory cell is higher than the first reference, outputting a result signal indicating that the nonvolatile memory cell is programmed into the desired state to the control engine, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

26. The semiconductor memory device according to claim 25, wherein the first reference is a reference memory cell.

27. The semiconductor memory device according to claim 26, wherein the desired state comprises a first value and wherein the control engine compares a first result with the first value and, in the case where the first result is not equal to the first value, applies the programming voltage.

28. The semiconductor memory device according to claim 25, wherein the nonvolatile memory cell includes a film which extends substantially parallel with a side face of the gate electrode and has the function of retaining charges.

29. The semiconductor memory device according to claim 25, wherein the nonvolatile memory cell includes (1) a film having a surface which extends substantially parallel with a surface of the gate insulating film and having the function of retaining charges, and (2) an insulating film for separating the film from the channel region or from the semiconductor layer, and wherein the thickness of the insulating film is larger than that of the gate insulating film and is 0.8 nm or more.

30. The semiconductor memory device according to claim 25, wherein the nonvolatile memory cell includes a film having a surface substantially parallel with a surface of the gate insulating film and having the function of retaining charges.

31. A portable electronic apparatus comprising the semiconductor memory device according to claim 25.

32. A semiconductor memory device including at least one nonvolatile memory cell comprising a programming circuit for verifying programming, to a desired state, of a nonvolatile memory cell having two possible states, each state corresponding to threshold voltage levels within a predetermined range, the nonvolatile memory cell holding a voltage level indicative of one of the states, the semiconductor memory device comprising a circuit for sensing over-programming of the nonvolatile memory cell, the sensing circuit including:

a plurality of read references corresponding to read voltages of the plurality of states, respectively;

a first reference corresponding to a first voltage, the first voltage specifying an upper-limit value of the desired state;

a control engine connected to the nonvolatile memory cell and the first reference for generating a selection signal to select the first reference and for sensing the present state of the nonvolatile memory cell; and a sense circuit connected to the first reference in accordance with the selection signal and connected to the nonvolatile memory cell and the control engine, the sense circuit for sensing the presently retained voltage of the nonvolatile memory cell, the sense circuit including:

a first comparator, connected to the nonvolatile memory cell, the control engine and the first reference, for comparing a threshold voltage level of the nonvolatile memory cell with the first reference and, in the case where the threshold voltage level of the nonvolatile memory cell is higher than the first reference, outputting a result signal to the control engine, the result signal indicating that the nonvolatile memory cell is over-programmed, wherein the nonvolatile memory cell includes a gate electrode formed on a semiconductor layer via a gate insulating film, a channel region formed below the gate electrode, a source and a drain as diffusion regions formed on both sides of the channel region and having a conductive type opposite to that of the channel region, and memory functional units formed on both sides of the gate electrode and having the function of retaining charges.

33. The semiconductor memory device according to claim 32, wherein the first reference is a reference memory cell.

34. The semiconductor memory device according to claim 33, wherein the desired state comprises a first value showing a desired state and wherein the control engine compares a first result signal with the first value and, in the case where the first result signal is not equal to the first value, indicates that the nonvolatile memory cell is over-programmed.

35. A portable electronic apparatus comprising the semiconductor memory device according to claim 32.

* * * * *